United States Patent
Pyo et al.

(10) Patent No.: US 9,431,083 B2
(45) Date of Patent: Aug. 30, 2016

(54) NONVOLATILE MEMORY DEVICE AND STORAGE DEVICE HAVING THE SAME

(71) Applicants: Suk-soo Pyo, Hwaseong-si (KR); Hyuntaek Jung, Seoul (KR)

(72) Inventors: Suk-soo Pyo, Hwaseong-si (KR); Hyuntaek Jung, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/593,171

(22) Filed: Jan. 9, 2015

(65) Prior Publication Data

US 2015/0279439 A1  Oct. 1, 2015

Related U.S. Application Data

(60) Provisional application No. 61/969,911, filed on Mar. 25, 2014.

(30) Foreign Application Priority Data

May 29, 2014  (KR) .......................... 10-2014-0065176

(51) Int. Cl.
| | | |
|---|---|---|
| *G11C 5/06* | (2006.01) | |
| *G11C 11/16* | (2006.01) | |
| *G11C 7/06* | (2006.01) | |
| *G11C 8/14* | (2006.01) | |
| *G11C 5/02* | (2006.01) | |

(52) U.S. Cl.
CPC ............. *G11C 11/1673* (2013.01); *G11C 5/06* (2013.01); *G11C 7/062* (2013.01); *G11C 8/14* (2013.01); *G11C 11/1659* (2013.01); *G11C 11/1675* (2013.01); *G11C 5/025* (2013.01)

(58) Field of Classification Search
CPC ............. G11C 13/0002; G11C 11/161; G11C 2213/79; G11C 7/18; G11C 11/1655; G11C 11/1657; G11C 11/4085; G11C 2029/1202; G11C 5/06; G11C 11/4094; G11C 13/0026; G11C 13/0028; G11C 11/5678; H01L 23/528; H01L 27/222
See application file for complete search history.

(56) References Cited

U.S. PATENT DOCUMENTS

| | | | |
|---|---|---|---|
| 6,111,781 A | 8/2000 | Naji | |
| 7,085,183 B2 | 8/2006 | Yang et al. | |
| 7,209,378 B2 | 4/2007 | Nejad et al. | |
| 7,286,395 B2 | 10/2007 | Chen et al. | |
| 7,436,699 B2 | 10/2008 | Tanizaki et al. | |
| 7,719,885 B2 | 5/2010 | Hidaka | |
| 7,791,931 B2 | 9/2010 | Chen et al. | |
| 7,852,662 B2 | 12/2010 | Yang et al. | |
| 7,903,448 B2 | 3/2011 | Oh et al. | |
| 7,995,378 B2 | 8/2011 | Yoon et al. | |
| 8,144,509 B2 | 3/2012 | Jung et al. | |
| 8,194,439 B2 | 6/2012 | Kim et al. | |
| 8,432,727 B2 | 4/2013 | Ryu et al. | |
| 8,508,987 B2 | 8/2013 | Tsuji et al. | |
| 8,634,232 B2 | 1/2014 | Oh | |
| 9,047,939 B2 * | 6/2015 | Kuo ..................... | G11C 7/18 |

(Continued)

*Primary Examiner* — Son Dinh
*Assistant Examiner* — Uyen B Tran
(74) *Attorney, Agent, or Firm* — Harness, Dickey & Pierce, P.L.C.

(57) ABSTRACT

A nonvolatile memory device according to the inventive concepts performs a read operation from a true cell storing data and complementary cell storing complementary data, thereby increasing or maximizing sensing margin. Also, the nonvolatile memory device connects a plurality of true cell/complementary cells to a word line, thereby markedly reducing the size of a memory cell array.

15 Claims, 19 Drawing Sheets

(56) References Cited

U.S. PATENT DOCUMENTS

| | | |
|---|---|---|
| 2005/0162883 A1 | 7/2005 | Nejad et al. |
| 2006/0013038 A1 | 1/2006 | Kaiyang et al. |
| 2007/0097730 A1 | 5/2007 | Chen et al. |
| 2007/0159870 A1 | 7/2007 | Tanizaki et al. |
| 2008/0175036 A1 | 7/2008 | Oh et al. |
| 2008/0266943 A1 | 10/2008 | Yang et al. |
| 2009/0154225 A1 | 6/2009 | Hidaka |
| 2009/0161413 A1 | 6/2009 | Yoon et al. |
| 2009/0213640 A1 | 8/2009 | Chen et al. |
| 2009/0323404 A1 | 12/2009 | Jung et al. |
| 2010/0067279 A1* | 3/2010 | Choi ............... G11C 8/14 365/51 |
| 2011/0157971 A1 | 6/2011 | Kim et al. |
| 2011/0267874 A1 | 11/2011 | Ryu et al. |
| 2012/0051122 A1 | 3/2012 | Tsuji et al. |
| 2012/0257444 A1 | 10/2012 | Oh |
| 2012/0257445 A1* | 10/2012 | Lee ............... G11C 5/063 365/158 |

* cited by examiner

NONVOLATILE MEMORY DEVICE AND STORAGE DEVICE HAVING THE SAME

CROSS-REFERENCE TO RELATED APPLICATIONS

This application claims the benefit of the U.S. Provisional application No. 61/969,911 filed Mar. 25, 2014, and Korean Patent Application No. 10-2014-0065176 filed May 29, 2014, the entire contents of each of which are hereby incorporated by reference.

BACKGROUND

The inventive concepts described herein relate to a nonvolatile memory device, a storage device including the nonvolatile memory device, and/or reading and writing methods thereof.

Due to high-speed and/or low-power electronic devices, there is an increasing demand on a semiconductor memory device that operates at high speed and with a low operation voltage. As the semiconductor memory device, a magnetic memory device has been developed to satisfy such requirements. The magnetic memory device comes into the spotlight as a next-generation semiconductor memory device due to its high-speed operation and/or nonvolatile characteristic.

In general, the magnetic memory device may contain a magnetic tunnel junction (MTJ) pattern. The MTJ pattern is formed of two magnetic materials and an insulation layer interposed therebetween. A resistance of the MTJ pattern may vary with magnetization directions of the two magnetic materials. For example, the MTJ pattern has the greatest resistance when magnetization directions of the two magnetic materials are anti-parallel to each other, and it has the smallest resistance when magnetization directions of the two magnetic materials are parallel to each other. Data may be written/read using a difference between resistance values.

SUMMARY

One aspect of some example embodiments of the inventive concepts is directed to provide a nonvolatile memory device comprising first and second true cells storing data; first and second complementary cells storing complementary data of the data; bit lines respectively connected to first ends of the first and second true cells; complementary bit lines respectively connected to first ends of the first and second complementary cells; a first sub word line connected to second ends of the first true cells; a second sub word line connected to second ends of the second true cells; a first complementary sub word line connected to second ends of the first complementary cells; a second complementary sub word line connected to second ends of the second complementary cells; and a first transistor configured to connect the first sub word line to a first source line in response to a first on voltage applied to a first word line; a first complementary transistor configured to connect the first complementary sub word line to a first complementary source line in response to the first on voltage; a second transistor configured to connect the second sub word line to the first source line in response to a second on voltage applied to a second word line; and a second complementary transistor configured to connect the second complementary sub word line to the first complementary source line in response to the second on voltage.

In some example embodiments, each of the first and second true cells and the first and second complementary cells is a magnetic tunnel junction (MTJ) cell.

In some example embodiments, the first and second word lines extend in a same direction as that of the first source line and the second complementary source line.

In some example embodiments, the nonvolatile memory device further comprises bit line selection transistors configured to selectively connect one of the bit lines to a first data line in response to column selection signals; and complementary bit line selection transistors configured to selectively connect one of the complementary bit lines to a second data line in response to the column selection signals.

In some example embodiments, the nonvolatile memory device further comprises an input buffer providing the first data line with a voltage corresponding to the data; and a second input buffer providing the complementary data line with a voltage corresponding to the complementary data.

In some example embodiments, after a pre-charge voltage is applied to the bit lines in a writing operation about one of the first and second true cells, a ground voltage is applied to a selected bit line, an on voltage is applied to a selected word line, and a write voltage is applied to the first source line.

In some example embodiments, after a ground voltage is applied to the complementary bit lines in a writing operation about one of the first and second complementary cells, the pre-charge voltage is applied to a selected complementary bit line, an on voltage is applied to a selected word line, and a ground voltage is applied to the first complementary source line.

In some example embodiments, the nonvolatile memory device further comprises a sense amplifier configured to sense voltages or currents at the first data line and the second data line.

In some example embodiments, after a ground voltage is applied to the bit lines at a reading operation about one of the first and second true cells, an on voltage is applied to a selected word line, and a ground voltage is applied to the first source line.

In some example embodiments, after a ground voltage is applied to the complementary bit lines at a reading operation about one of the first and second complementary cells, an on voltage is applied to a selected word line, and a ground voltage is applied to the first complementary source line.

In some example embodiments, the nonvolatile memory device further comprises a source line control circuit configured to control a voltage applied to the first source line and the first complementary source line independently in response to source line control signals.

In some example embodiments, the nonvolatile memory device further comprises a source line control signal generator configured to generate the source line control signals in response to data, a read enable signal, and a write enable signal.

In some example embodiments, the on voltage is a power supply voltage.

Another aspect of some embodiments of the inventive concepts is directed to provide a storage device comprising at least one nonvolatile memory device; and a memory controller configured to control the at least one nonvolatile memory device, wherein the at least one nonvolatile memory device comprises a memory cell array that is configured, in a writing operation, to pre-charge bit lines and complementary bit lines with different pre-charge voltages, connect a source line to true cells by applying an on voltage to a selected word line or to connect a complementary source line to complementary cells by applying the on voltage to the selected word line, to store data in the true cells by applying different write voltages to the source line and the complementary source line, and to store complementary data in the complementary cells.

In some example embodiments, first ends of the true and complementary cells are connected to a sub word line, the second ends of the true cells are connected to the bit lines, and second ends of the complementary cells are connected to the complementary bit lines. The at least one nonvolatile memory device further comprises a transistor configured to connect the sub word line to the source line and the complementary source line in response to the on voltage applied to the selected word line. The source line and the complementary source line are formed of a single signal line. The true cells and the complementary cell connected to the sub word line are alternatively disposed.

In some example embodiments, first ends of the true and complementary cells are connected to a sub word line, second ends of the true cells are connected to the bit lines, and second ends of the complementary cells are connected to the complementary bit lines. The at least one nonvolatile memory device further comprises a transistor configured to connect the sub word line to the source line and the complementary source line in response to the on voltage applied to the selected word line. The source line and the complementary source line are formed of a single signal line. A group of the true cells connected to the sub word line and a group of the complementary cell connected to the sub word line are disposed to be adjacent to each other.

In some example embodiments, first ends of the true cells are connected to a sub word line, first ends of the complementary cells are connected to a complementary sub word line, second ends of the true cells are connected to the bit line, and second ends of the complementary cells are connected to the complementary bit lines. The at least one nonvolatile memory device further comprises a transistor configured to connect the sub word line to the source line in response to the on voltage applied to the selected word line; and a complementary transistor configured to connect the sub word line to the complementary source line in response to the on voltage applied to the selected word line.

In some example embodiments, at a reading operation, a ground voltage is applied to the bit lines and the complementary bit lines, the on voltage is applied to a selected word line, a read voltage is applied to the source line and the complementary source line, and a voltage or a current at a selected bit line or a selected complementary bit line is sensed.

In one embodiment, the non-volatile memory device, includes a source line structure, a plurality of true memory cells connected between first respective bit lines and a sub word line structure, a plurality of complementary memory cells connected between respective complementary bit lines and the sub word line structure, a selection structure configured to selectively electrically connect the source line structure to the sub word line structure, and a control circuit configured to control the selection structure during at least one of a read operation and a write operation such that a first sub word line in the sub word line structure is connected to a first source line in the source line structure and a second sub word line in the sub word line structure is connected to a second source line in the source line structure based on application of an on voltage to single word line, the first sub word line connected the plurality of true memory cells, and the second sub word line connected to the plurality of complementary memory cells.

In one embodiment, the first sub word line and the second sub word line are one of a same sub word line and different sub word lines, and the first source line and the second source line are one of a same source line and different source lines.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
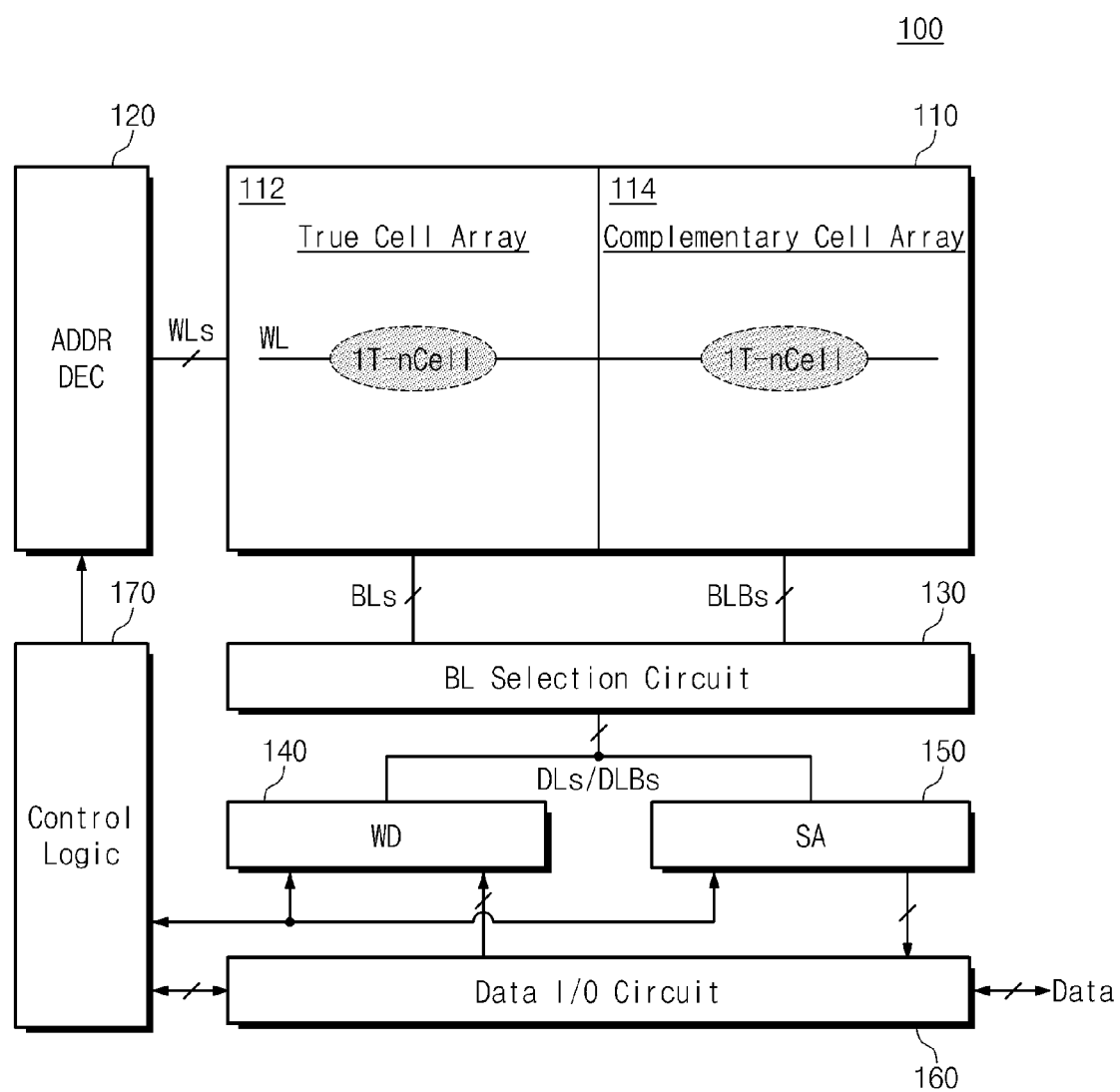
FIG. 1 is a block diagram schematically illustrating a nonvolatile memory device according to an example embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concepts of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In a nonvolatile memory device according to an embodiment of the inventive concepts, true cells for storing data and complementary cells for storing complementary data may be implemented to have a "1T-nCell" structure, thereby increasing or maximizing sensing margin and markedly reducing a chip size. Herein, the "1T-nCell" structure may be a structure where one end of a transistor is connected to one of the ends of each memory cell and the other ends of the memory cells are respectively connected to bit lines. Herein, each of the memory cells may be a true cell or a complementary cell.

FIG. 1 is a block diagram schematically illustrating a nonvolatile memory device according to an example embodiment of the inventive concepts. Referring to FIG. 1, a nonvolatile memory device 100 contains a memory cell array 110, an address decoder 120, a bit line selection circuit 130, a write driver circuit 140, a sense amplifier circuit 150, and a data input/output circuit 160, and control logic 170.

The memory cell array 110 includes a plurality of nonvolatile memory cells for storing data. For example, the memory cell array 110 may include resistive memory cells, such as PRAM (Phase Change RAM) cells or RRAM (Resistance RAM) cells or memory cells, such as NFGM (Nano Floating Gate Memory) cells, PoRAM (Polymer Random Access Memory) cells, MRAM (Magnetic Random Access Memory) cells, or FRAM (Ferroelectric Random Access Memory) cells. In particular, the memory cell array 110 may contain STT-MRAM (Spin Transfer Torque Magneto Resistive Random Access Memory) cells. For example, each of the memory cells may be of magnetic tunnel junction (MTJ) with a magnetic material.

The memory cell array 110 comprises a true cell array 112 for storing data and a complementary cell array 114 for storing complementary data. In some example embodiments, each of the true cell array 112 and the complementary cell array 114 may include STT-MRAM cells. Below, a memory cell included in the true cell array 112 is named a true cell, and a memory cell included in the complementary cell array 114 is named a complementary cell.

In some example embodiments, true cells and complementary cells may be implemented with a 1T-nCell structure. In the 1T-nCell structure, a plurality of memory cells may be connected to one transistor corresponding to any one word line.

The true cells/complementary cells included in the memory cell array 110 may be selected using a row address and a column address. For example, at least one of the word lines may be selected with the row address, and at least one of the bit lines may be selected with the column address. Although not shown in FIG. 1, a plurality of true cells/complementary cells may be connected to one word line.

The address decoder 120 decodes an input address ADDR into a row address and a column address. The address decoder 120 selects one of the word lines based on the row address. The address decoder 120 also provides the column address to the bit line selection circuit 130.

The bit line selection circuit 130 connects data lines to selected bit lines/complementary bits in response to the column address. For example, the address decoder 120 may contain components such as a row decoder, a column decoder, an address buffers, and so on.

The bit line selection circuit 130 is connected to the memory cell array 110 via bit lines/complementary bit lines BLs/BLBs and to the write driver circuit 140 and the sense amplifier circuit 150. The bit line selection circuit 130 operates in response to a control of the control logic 170. The bit line selection circuit 130 is configured to receive a decoded column address from the address decoder 120. The bit line selection circuit 130 selects bit lines/complementary bit lines using the decoded column address. For example, in a writing operation, the bit line selection circuit 130 connects selected bit lines/complementary bit lines to data lines/complementary data lines DLs/DLBs. That is, the bit line selection circuit 130 is connected to the write driver circuit 140 via the data lines/complementary data lines DLs/DLBs. During a reading operation, the bit line selection circuit 130 connects the selected bit lines/complementary bit lines to the sense amplifier circuit 150.

The write driver circuit 140 operates according to a control of the control logic 170. The write driver circuit 140 is configured to program memory cells (true cells and complementary cells) that are connected to bit lines/complementary bit lines selected by the bit line selection circuit 130 and to a word line selected by the address decoder 120. The write driver circuit 140 generates a current or a voltage based on data from the data input/output circuit 160 and outputs it to the selected bit lines/complementary bit lines.

The sense amplifier circuit 150 operates according to a control of the control logic 170. The sense amplifier circuit 150 may contain a plurality of sense amplifiers (not shown) to read true cells/complementary cells that are connected to bit lines/complementary bit lines selected by the bit line selection circuit 130 and to a word line selected by the address decoder 120.

To read memory cells, the sense amplifiers sense currents flowing via selected bit lines/complementary bit lines or voltages at the selected bit lines/complementary bit lines. The sense amplifier circuit 150 outputs the read data to the data input/output circuit 160.

The data input/output circuit 160 operates according to a control of the control logic 170. The data input/output circuit 160 sends data received from an external device to the write driver circuit 140. The data input/output circuit 160 sends data received from the sense amplifier circuit 150 to the external device.

The control logic 170 controls an overall operation of the nonvolatile memory device 100. The control logic 170 may operate in response to a command or control signals received from the external device.

The nonvolatile memory device 100 according to an embodiment of the inventive concepts is configured to read a true cell storing data and a complementary cell storing complementary data, thereby maximizing sensing margin.

Also, in the nonvolatile memory device 100 according to an embodiment of the inventive concepts, a word line is connected with a plurality of true cells/complementary cells, thereby markedly reducing the size of the memory cell array 110.

Figure 2:
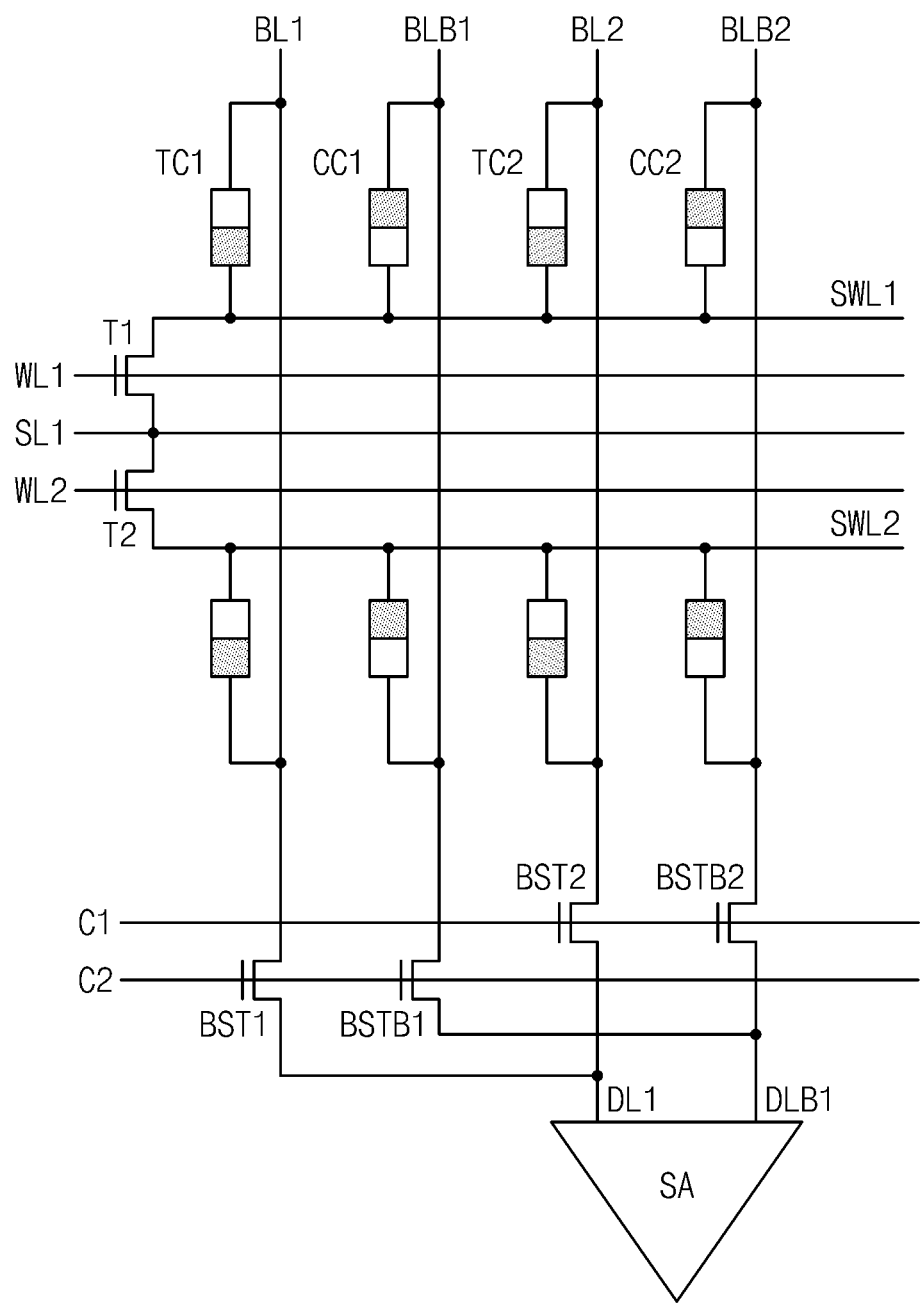
FIG. 2 is a diagram schematically illustrating a 1T-nCell structure shown in FIG. 1, according to an embodiment of the inventive concepts.

FIG. 2 is a diagram schematically illustrating a 1T-nCell structure shown in FIG. 1, according to an embodiment of the inventive concepts. Referring to FIG. 2, a first sub word line SWL1 is connected to a plurality of true cells TC1 and TC2 and a plurality of complementary cells CC1 and CC2. The first sub word line SWL1 is connected to a source line SL1 via a first transistor T1. A gate of the transistor T1 is connected to a first word line Wl1. The true cells TC1 and TC2 are connected between the sub word line SWL1 and bit lines BL1 and B2. The complementary cells CC1 and CC2 are connected between the sub word line SWL1 and complementary bit lines BLB1 and BLB2.

A second sub word line SWL2 is connected to a plurality of true cells and a plurality of complementary cells. The second sub word line SWL2 is connected to the source line SL1 via a second transistor T2. A gate of the second transistor T2 is connected to a second word line WL2.

Bit line selection transistors BST1 and BST2 connect respective bit lines BL1 and BL2 to a data line DL1 of a sense amplifier SA in response to column selection signals C1 and C2. Complementary bit line selection transistors BSTB1 and BSTB2 connect respective complementary bit lines BLB1 and BLB2 to a data line DLB1 of the sense amplifier SA in response to the column selection signals C1 and C2.

In FIG. 2, a 1T-nCell structure is shown as two true cells TC1 and TC2 and two complementary cells CC1 and CC2 connected to a transistor T1. However, the inventive concepts are not limited thereto. For example, three or more true cells and three or more complementary cells may be connected to a transistor.

In FIG. 2, the 1T-nCell structure is shown as true cells and complementary cells arranged in turn. However, the inventive concepts are not limited thereto. The 1T-nCell structure may be changed such that a true cell group and a complementary cell group are arranged in turn.

Figure 3:
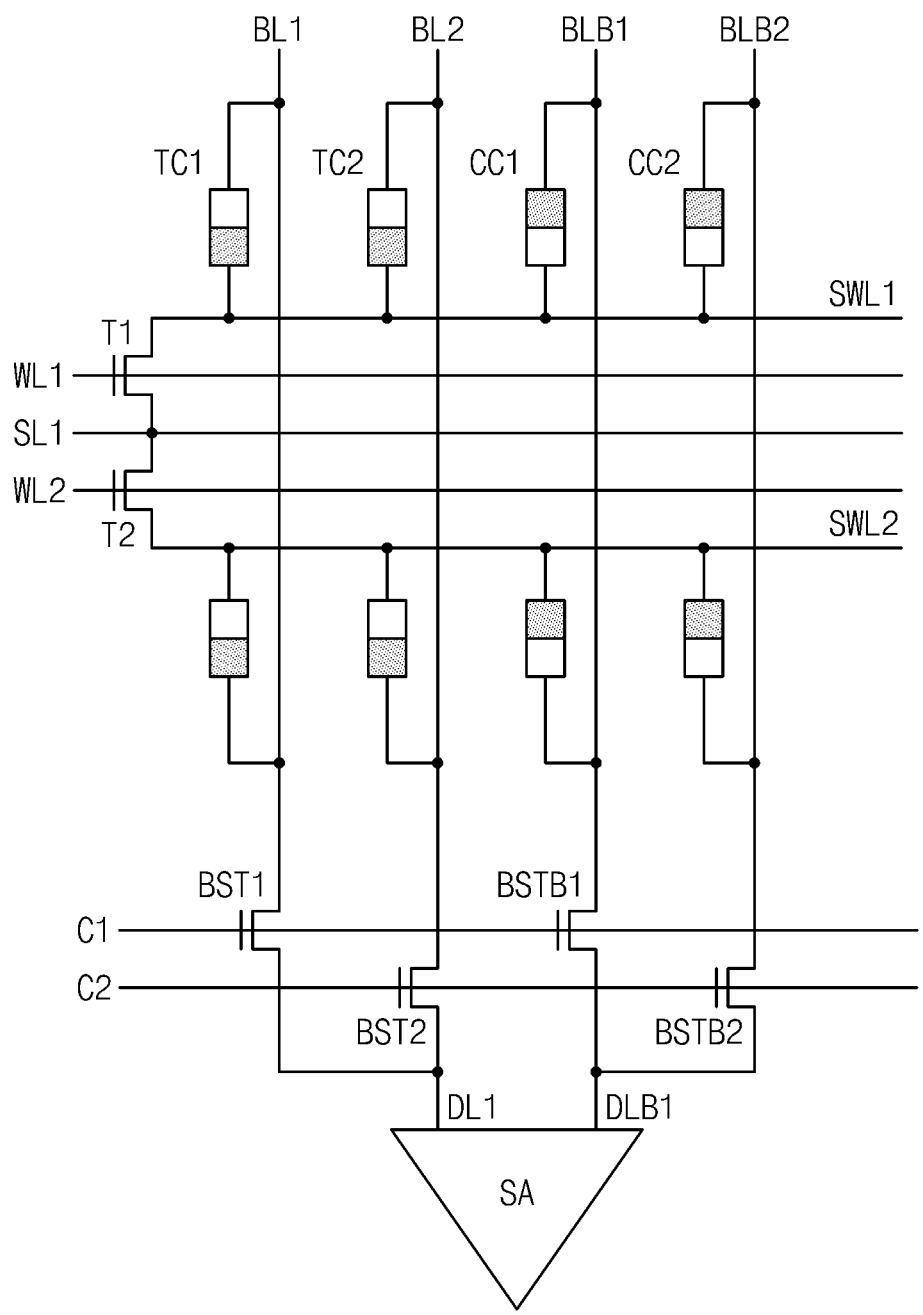
FIG. 3 is a diagram schematically illustrating a 1T-nCell structure shown in FIG. 1, according to another embodiment of the inventive concepts.

FIG. 3 is a diagram schematically illustrating a 1T-nCell structure shown in FIG. 1, according to another embodiment of the inventive concepts. Referring to FIG. 3, a true cell group formed of true cells TC1 and TC2 is disposed to be relatively close to a transistor T1, and a complementary cell group formed of complementary cells CC1 and CC2 is disposed to be relatively far from the transistor T1. However, the inventive concepts are not limited thereto. For example, the complementary cell group may be disposed to be relatively close to the transistor T1, and the true cell group may be disposed to be relatively far from the transistor T1.

In FIG. 3, an embodiment of the inventive concepts is shown as a true cell group and a complementary cell group sharing sub word lines SWL1 and SWL2 and a source line SL1. However, the inventive concepts are not limited thereto. The 1T-nCell structure of the inventive concepts may be changed or modified such that the true cell group and the complementary cell group are connected to sub word lines and source lines independently of each other.

Figure 4:
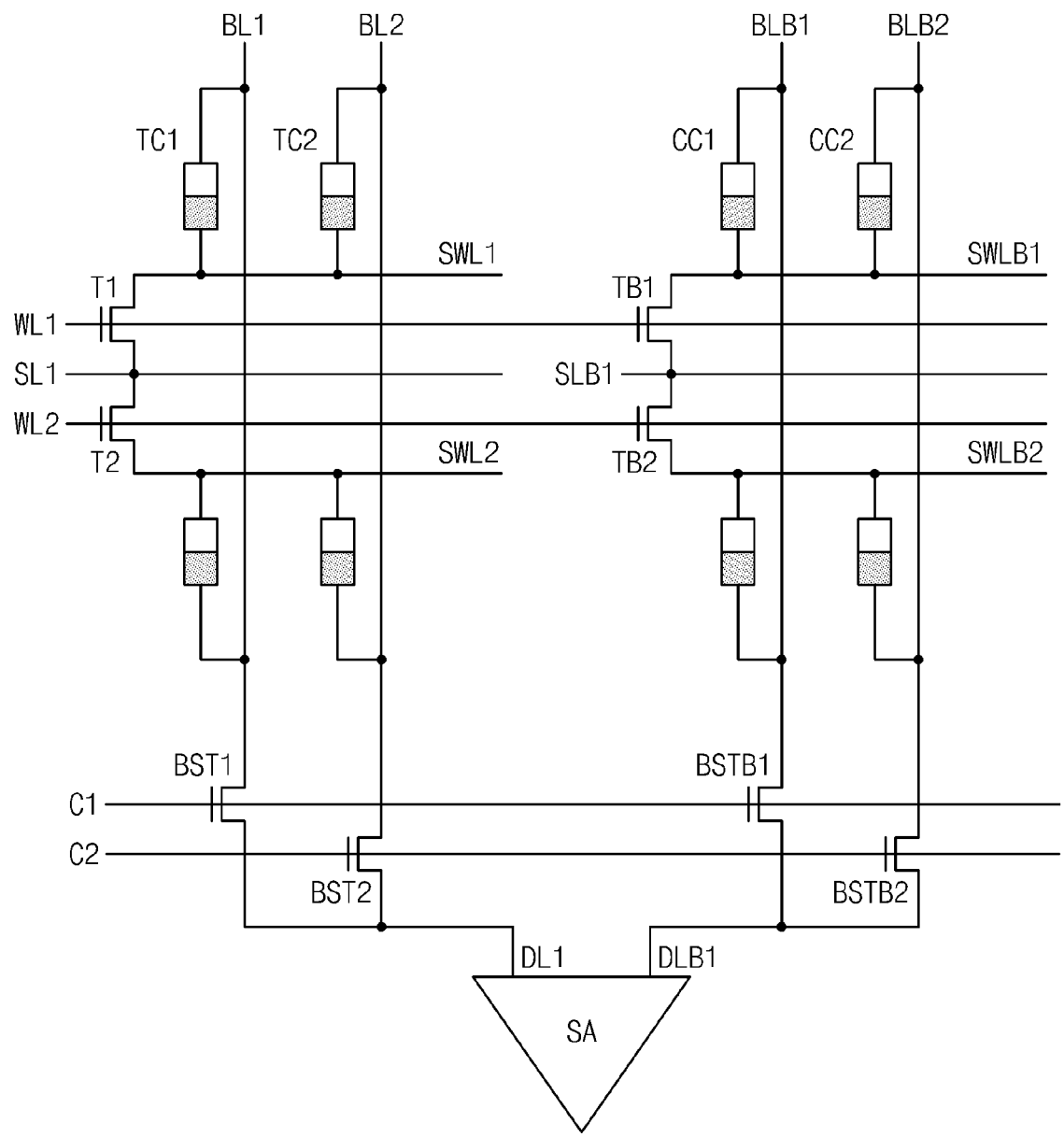
FIG. 4 is a diagram schematically illustrating a 1T-nCell structure shown in FIG. 1, according to still another embodiment of the inventive concepts.

FIG. 4 is a diagram schematically illustrating a 1T-nCell structure shown in FIG. 1, according to still another embodiment of the inventive concepts. Referring to FIG. 4, a 1T-nCell structure contains separated sub word lines SWL1 and SWL2 and separated source lines SL1 and SLB1.

The first sub word line SWL1 is connected a plurality of true cells TC1 and TC2. The first sub word line SWL1 is connected to the first source line SL1 via a first transistor T1. A gate of the first transistor T1 is connected to a first word line WL1. The first true cells TC1 and TC2 are connected between the first sub word line SWL1 and bit lines BL1 and BL2.

The first complementary sub word line SWLB1 is connected a plurality of second complementary cells CC1 and CC2. The first complementary sub word line SWLB1 is connected to the first complementary source line SLB1 via a first complementary transistor TB1. A gate of the first complementary transistor TB1 is connected to the first word line WL1. The first complementary cells CC1 and CC2 are connected between the first complementary sub word line SWLB1 and complementary bit lines BLB1 and BLB2.

A plurality of second true cells are connected to the second sub word line SWL2. The second sub word line SWL2 is connected to the first source line SL1 via a second transistor T2. A gate of the second transistor T2 is connected to a second word line WL2. The second true cells are connected between the second sub word line SWL2 and the bit lines BL1 and BL2.

The second complementary sub word line SWLB2 is connected a plurality of second complementary cells. The second complementary sub word line SWLB2 is connected to the first complementary source line SLB1 via a second complementary transistor TB2. A gate of the second complementary transistor TB2 is connected to the second word line WL2. The second complementary cells are connected between the second complementary sub word line SWLB2 and the complementary bit lines BLB1 and BLB2.

Figure 5:
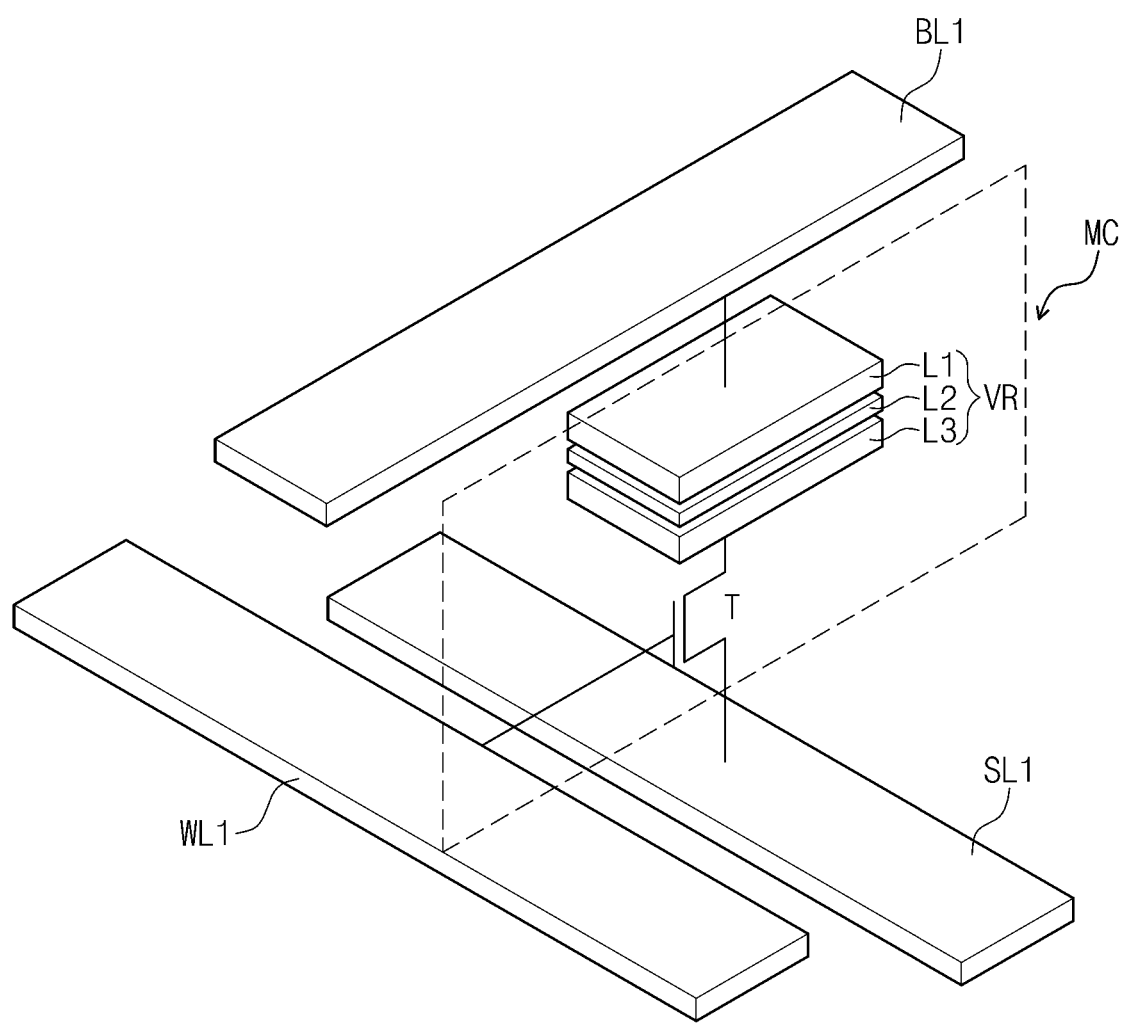
FIG. 5 is a perspective view of a memory cell according to an embodiment of the inventive concepts.

FIG. 5 is a perspective view of a memory cell according to an embodiment of the inventive concepts. Referring to FIG. 5, a memory cell MC may be a true cell or a complementary cell. The memory cell MC includes a resistance-variable element VR and a cell transistor T (T1, in case of FIG. 2). A gate of the cell transistor T is connected to a word line WL1, one end thereof to a bit line BL1 via the resistance-variable element VR, and the other end thereof to a source line SL1.

The resistance-variable element VR includes a pinned layer L3, a free layer L1, and a tunnel layer L2 interposed between the pinned layer L3 and the free layer L1. A magnetization direction of the pinned layer L3 may be pinned. A magnetization direction of the free layer L1 may have the same direction as the pinned layer L3 or a direction opposite to the pinned layer L3 according to a condition. An anti-ferromagnetic layer (not shown) may be further provided to pin a magnetization direction of the pinned layer L3.

In some example embodiments, the free layer L1 may contain a material with a variable magnetization direction. A magnetization direction of the free layer L1 may be changed due to an external or internal electrical/magnetic factor. The free layer L1 may contain a ferroelectric material including at least one of Co, Fe, or Ni. For example, the free layer L1 may contain at least one selected from a group of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12.

In some example embodiments, a thickness of the tunnel layer L2 may be smaller than a spin diffusion distance. The tunnel layer L2 may contain a nonmagnetic material. For example, the tunnel layer L2 may contain at least one selected from a group of Mg oxide, Ti oxide, Al oxide, Mg—Zn oxide, Mg—B oxide, Ti nitride, and V nitride.

In some example embodiments, the pinned layer L3 may be of a magnetization direction that is fixed by a pinning layer (not shown). The pinned layer L3 may also contain a ferromagnetic material. For example, the pinned layer L3 may contain at least one selected from a group of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12.

In some example embodiments, the pinning layer may contain an anti-ferromagnetic material. For example, the pinning layer may contain at least one selected from a group of PtMn, IrMn, MnO, MnS, MnTe, MnF2, FeCl2, FeO, CoCl2, CoO, NiCl2, NiO, and Cr.

During a read operation for the memory cell, a logically high voltage may be applied to the word line WL1 to turn on the cell transistor CT. A read current may be provided in a direction from the bit line BL1 to the source line SL to measure a resistance value of the resistance-variable element VR. Data stored in the resistance-variable element VR may be read according to the resistance value thus measured.

In some example embodiments, a direction in which the word line WL1 extends may be equal to that in which the source line SL1 extends.

In some example embodiments, a direction in which the word line WL1 extends and a direction in which the source line SL1 extends may be right-angled.

Figure 6:
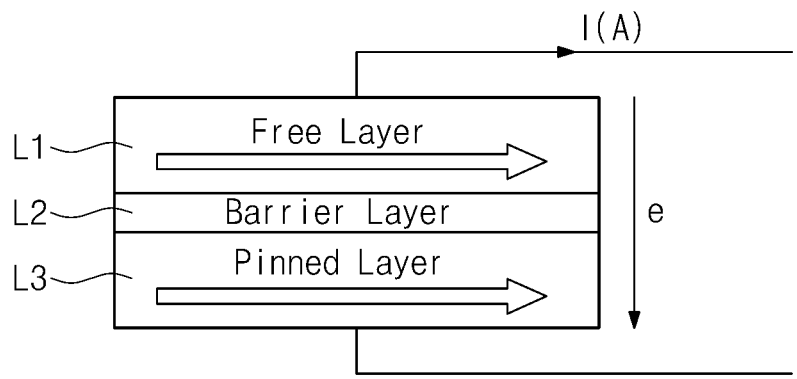
FIGS. 6 and 7 are diagrams schematically illustrating magnetization directions of a resistance-variable element according to data stored in a memory cell shown in FIG. 5.
Figure 7:
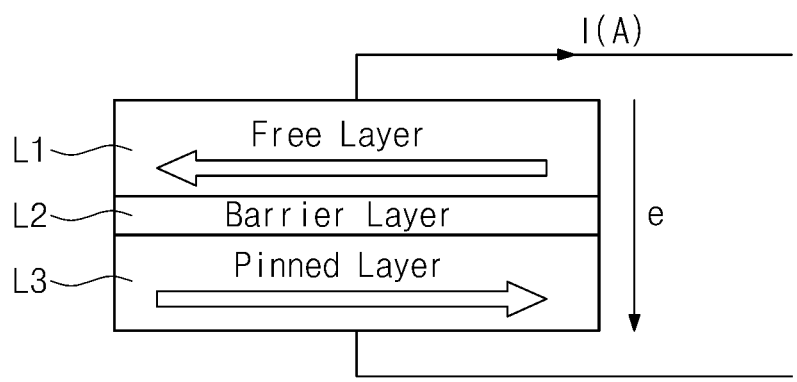

FIGS. 6 and 7 are diagrams schematically illustrating magnetization directions of a resistance-variable element according to data stored in a memory cell shown in FIG. 5.

A resistance value of a resistance-variable element may vary with a magnetization direction of a free layer L1. If a read current I(A) is applied to the resistance-variable element, there may be output a data voltage according to a resistance value of the resistance-variable element. Since the intensity of the read current I(A) is smaller than that of a write current, in general, a magnetization direction of the free layer L1 may not be changed by the read current I(A).

Referring to FIG. 6, magnetization directions of free and pinned layers L1 and L3 of the resistance-variable element may be parallel. Thus, the resistance-variable element may have a small resistance value. In this case, data '0' may be read, for example.

Referring to FIG. 7, magnetization directions of the free and pinned layers L1 and L3 may be anti-parallel. Thus, the resistance-variable element may have a great resistance value. In this case, data '1' may be read, for example.

In FIGS. 6 and 7, the free and pinned layers L1 and L3 of the resistance-variable element may be illustrated as being a horizontal magnetic element. However, the inventive concepts are not limited thereto. For example, the free and pinned layers L1 and L3 of the resistance-variable element can be implemented with a vertical magnetic element.

Figure 8:
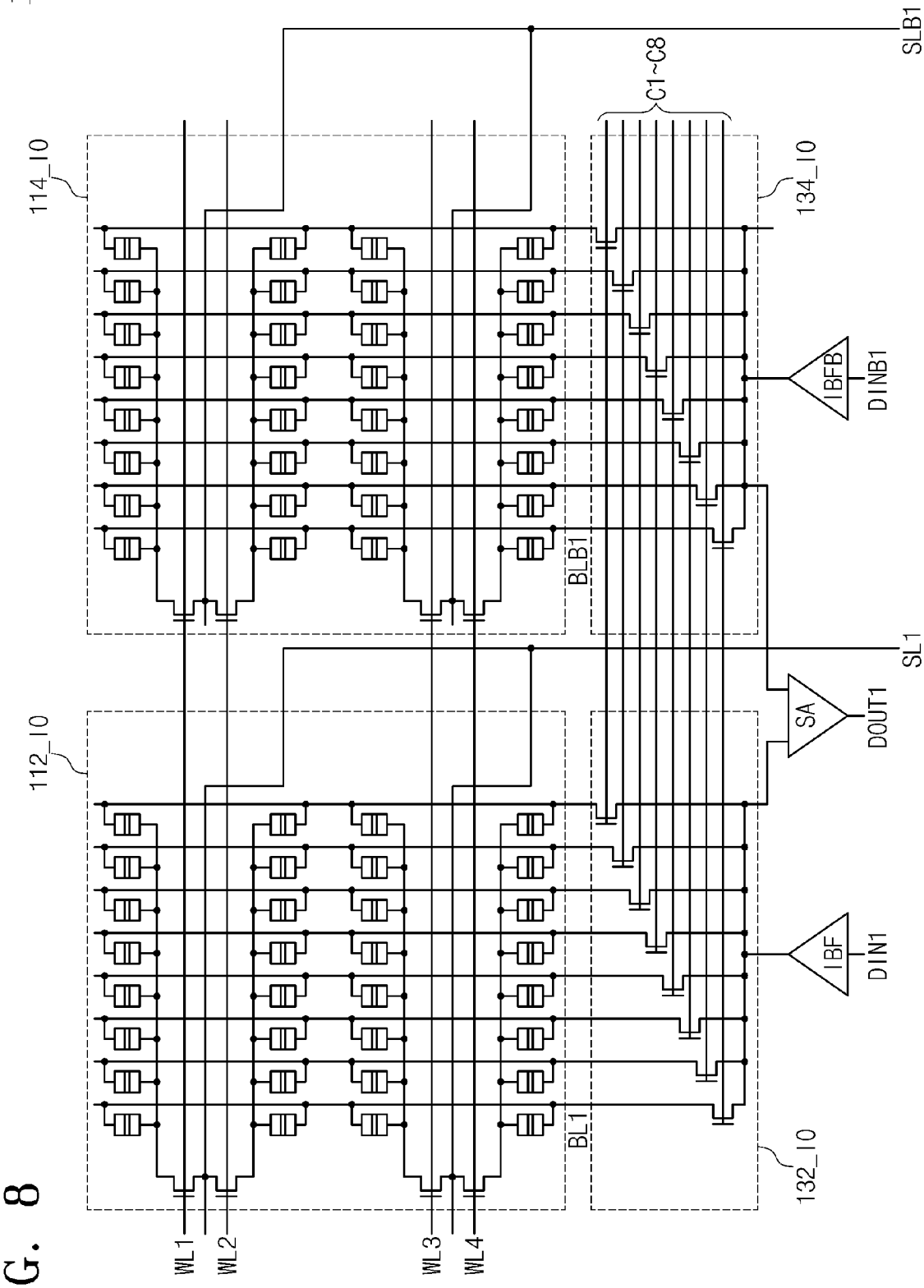
FIG. 8 is a diagram schematically illustrating a portion of a nonvolatile memory device to describe a write and a read operation performed by an I/O unit, according to an embodiment of the inventive concepts.

FIG. 8 is a diagram schematically illustrating a portion of a nonvolatile memory device to describe a write and a read operation performed by an I/O unit, according to an embodiment of the inventive concepts. Referring to FIG. 8, a memory cell structure may be based on a 1T-nCell structure.

In a writing operation, data DIN is provided to an input buffer IBF, and complementary data DINB is provided to a complementary input buffer IBFB. When a bit line selection transistor corresponding to the input data is turned on in response to column selection signals C1 to C8, a voltage or a current corresponding to data stored in the input buffer IBF may be provided to a bit line selected by the bit line selection transistor thus turned on. Data stored in the input buffer IBF is written at a true cell connected to a selected word line and the selected bit line.

When a bit line selection transistor corresponding to the input complementary data is turned on in response to the column selection signals C1 to C8, a voltage or a current corresponding to complementary data stored in the complementary input buffer IBFB may be provided to a complementary bit line selected by the bit line selection transistor thus turned on. Data stored in the complementary input buffer IBFB is written at a complementary cell connected to the selected word line and the selected complementary bit line.

During a reading operation, to a sense amplifier SA are provided a voltage or a current corresponding to a true cell connected to a selected word line and a selected bit line and a voltage or a current corresponding to a complementary cell connected to the selected word line and a selected complementary bit line. The sense amplifier determines whether data stored in the true cell is "1" or "0", based on the input voltages or currents. The sense amplifier may output the determination result as data DOUT.

In FIG. 8, true cell groups 112_IO share a source line SL1, and complementary cell groups 114_IO share a source line SLB1. However, the inventive concepts are not limited thereto. For example, a memory cell array of the inventive concepts may be implemented such that source lines are controlled independently of each other.

Figure 9:
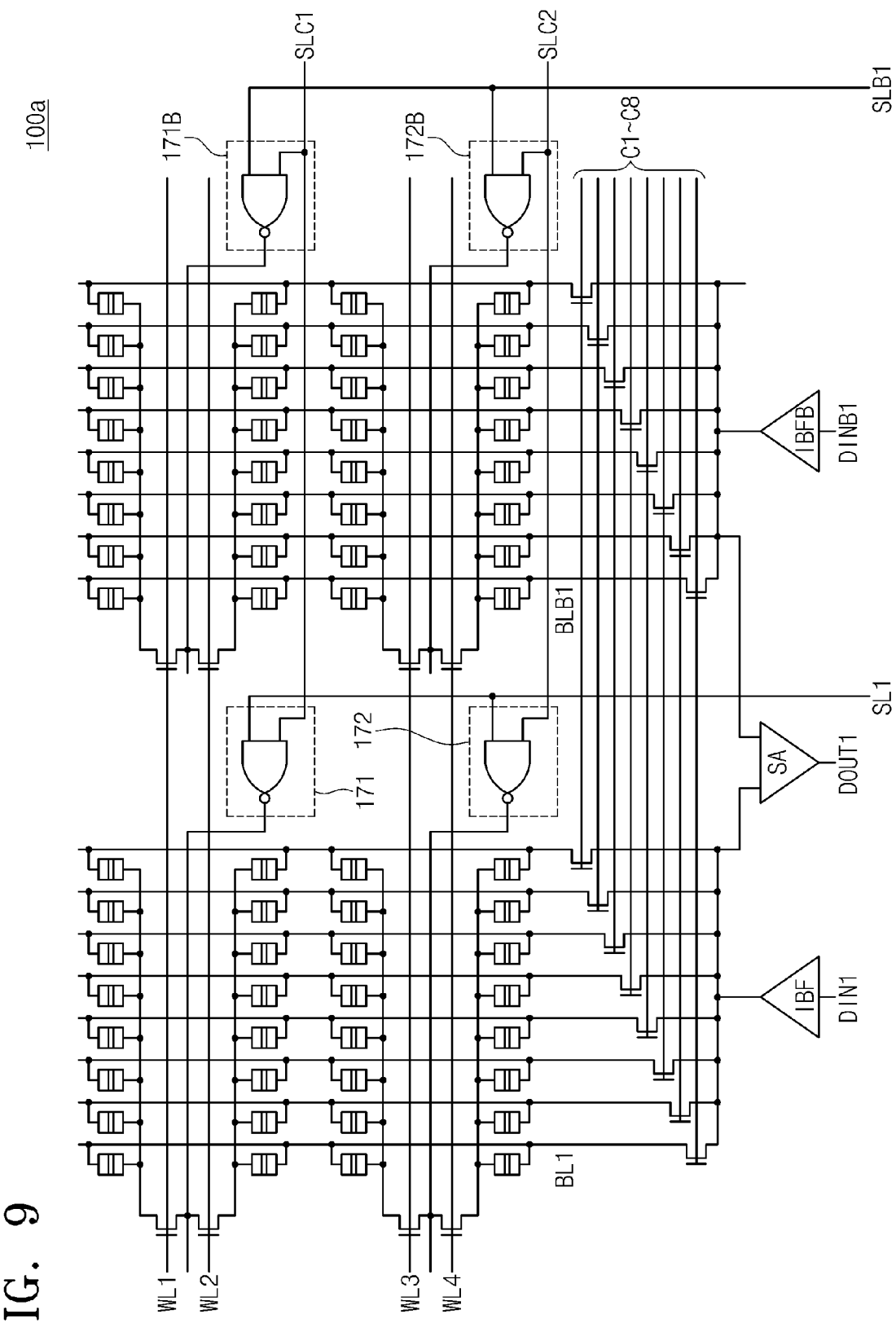
FIG. 9 is a diagram schematically illustrating a portion of a nonvolatile memory device to describe a write and a read operation performed by an I/O unit, according to another embodiment of the inventive concepts.

FIG. 9 is a diagram schematically illustrating a portion of a nonvolatile memory device to describe a write and a read operation performed by an I/O unit, according to another embodiment of the inventive concepts. Referring to FIG. 9, a nonvolatile memory device 110a further contains source line control circuits 171, 172, 171B, and 172B.

The source line control circuits 171, 172, 171B, and 172B controls source lines SL1, SL2, SLB1, and SLB2 in response to source line control signals SL1, SLC1, SL2, and SLC2. In example embodiments, the source line control circuits 171, 172, 171B, and 172B may be formed of a NAND gate circuit.

The nonvolatile memory device 110a according to an embodiment of the inventive concepts controls separated source lines SL1, SLB1, SL2, and SLB2 at a reading/writing operation independently, thereby improving an operation speed and reducing or minimizing power consumption.

Figure 10:
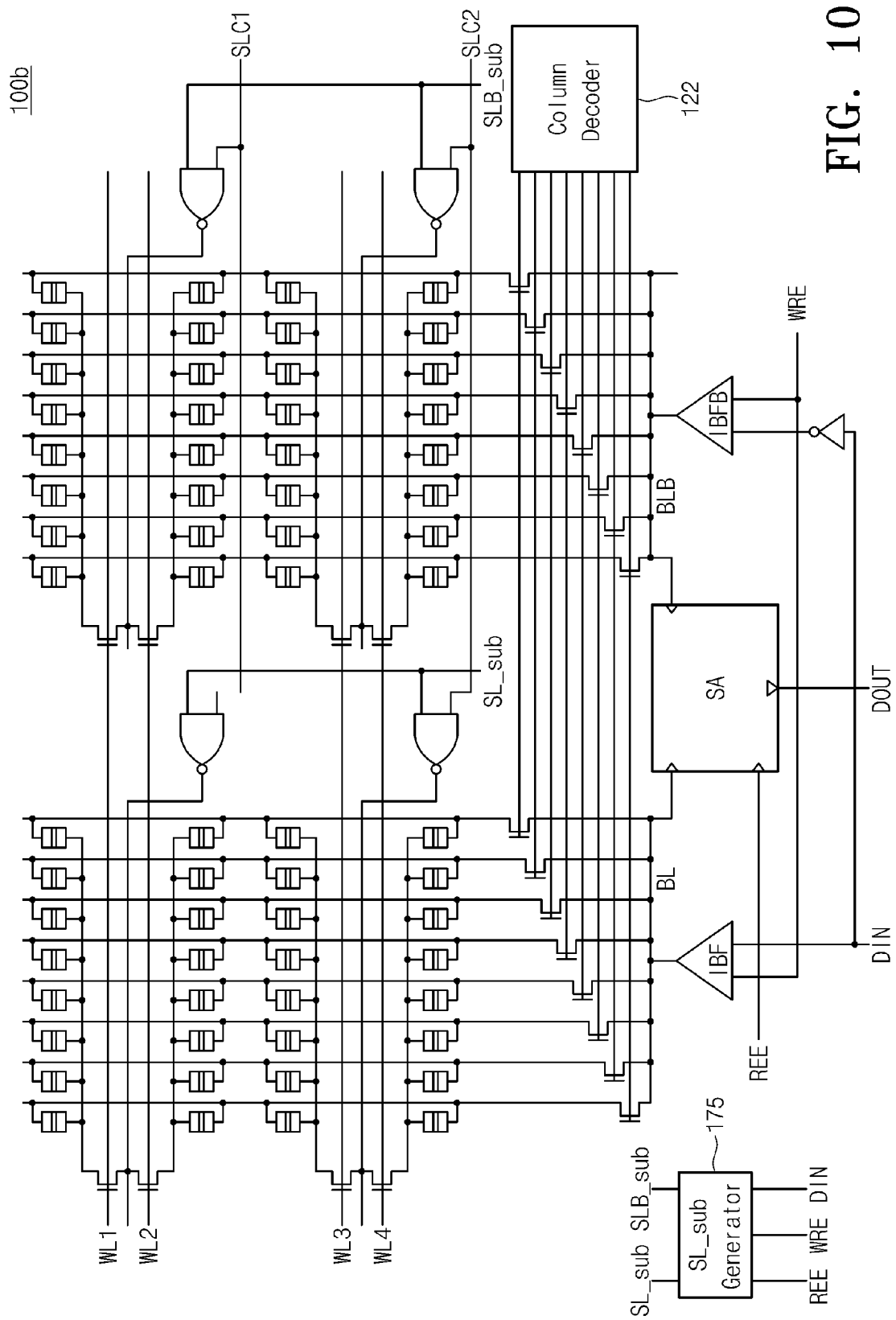
FIG. 10 is a block diagram schematically illustrating for describing a writing operation and a reading operation of a nonvolatile memory device 100a shown in FIG. 9.

FIG. 10 is a block diagram schematically illustrating, for describing a writing operation and a reading operation, a nonvolatile memory device 100a shown in FIG. 9. Referring to FIG. 10, a nonvolatile memory device 100b may be substantially the same as that 100a shown in FIG. 9 except that the nonvolatile memory device 100b further comprises a column decoder 122 and a source line control signal generator 175.

The column decoder 122 decodes a column address of an input address ADDR (refer to FIG. 1) to generate column selection signals C1 to C8.

The source line control signal generator 175 generates source line control signals SL_sub and SLB_sub in response to a read enable signal REE, a write enable signal WRE, and input data DIN.

An input buffer IBF provides a selected bit line with a corresponding voltage/current in response to the input data DIN and the write enable signal WRE. A complementary input buffer IBFB provides a selected complementary bit line with a corresponding voltage/current in response to an inverted value of the input data DIN and the write enable signal WRE.

The sense amplifier SA outputs data DOUT based on voltages or currents sensed from a selected bit line and a selected complementary bit line.

Figure 11:
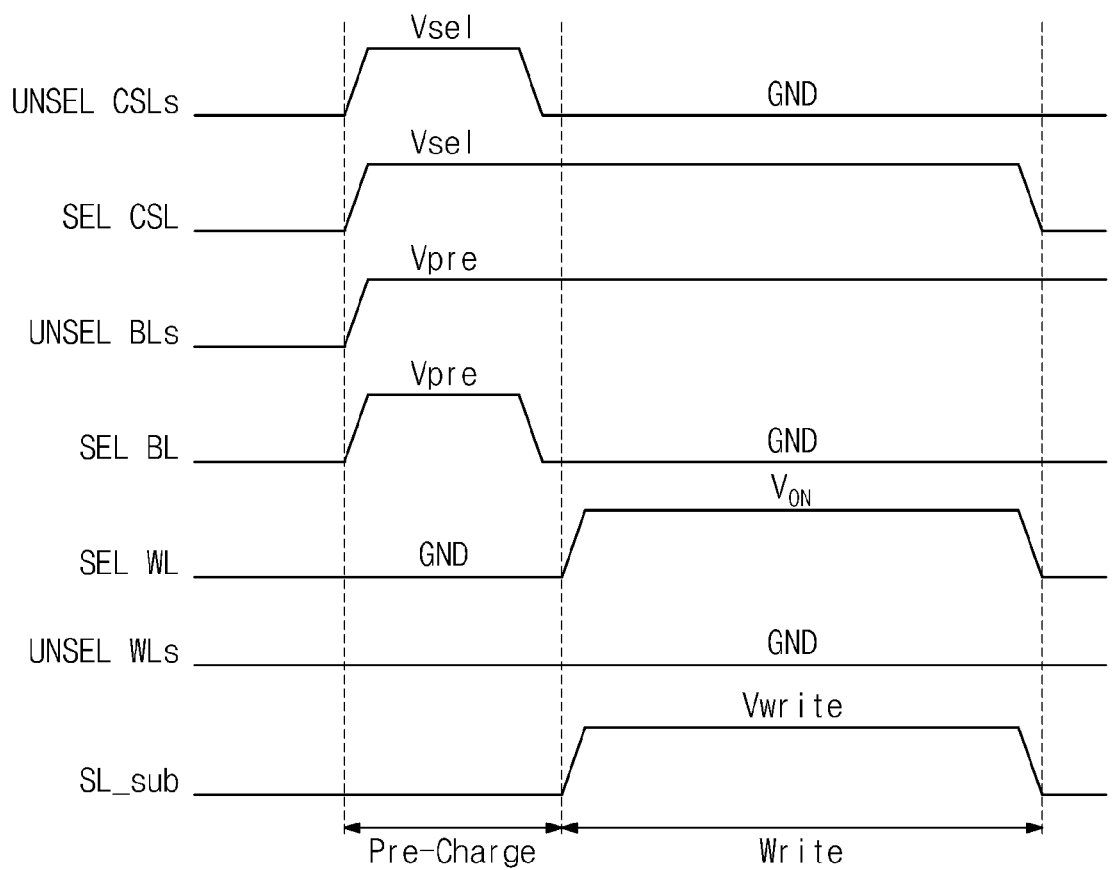
FIG. 11 is a timing diagram for describing a writing operation about a true cell of a nonvolatile memory device according to an embodiment of the inventive concepts.

FIG. 11 is a timing diagram for describing a writing operation about a true cell of a nonvolatile memory device according to an embodiment of the inventive concepts. Referring to FIG. 11, a writing operation for a true cell TC is divided into a pre-charge period and a writing period.

During the pre-charge period, a selection voltage Vsel is applied to unselected column selection lines UNSEL CSLs and a selected column selection line SEL CSL such that a pre-charge voltage Vpre is applied to all bit lines SEL BL and UNSEL BLs; simultaneously, the pre-charge voltage Vpre is applied to unselected bit lines UNSEL BLs and selected bit lines SEL BL. A ground voltage GND is applied to word lines SEL WL and UNSEL WLs and a source line SL_sub.

During a writing period, a ground voltage GND is applied to the unselected column selection lines UNSEL CSLs, and the selected column selection line SEL CSL is maintained with the selection voltage Vsel. Thus, the unselected bit lines UNSEL BLs maintain the pre-charge voltage Vpre of the pre-charge period; on the other hand, a ground voltage GND is applied to the selected bit line SEL BL by data stored in the input buffer IBF. At this time, an on voltage Von is applied to the selected word line SEL WL to turn on a transistor T1, and the unselected word lines UNSEL WLs are maintained with a ground voltage GND. In some example embodiments, the on voltage Von may be a power supply voltage.

A write voltage Vwrite is applied to a source line SL_sub to write data at a true cell TC connected to the selected bit line SEL BL. At this time, the true cell TC connected to the selected bit line SEL BL and the source line SL_sub are electrically connected by transistor T1 receiving the on voltage Von. That is, a ground voltage GND is applied to one end of the true cell TC connected to the selected bit line SEL BL, and the write voltage Vwrite is applied to the other end of the true cell TC connected to the source line SL_sub. With the above-described bias condition, since current flows into the true cell TC, data is stored.

Figure 12:
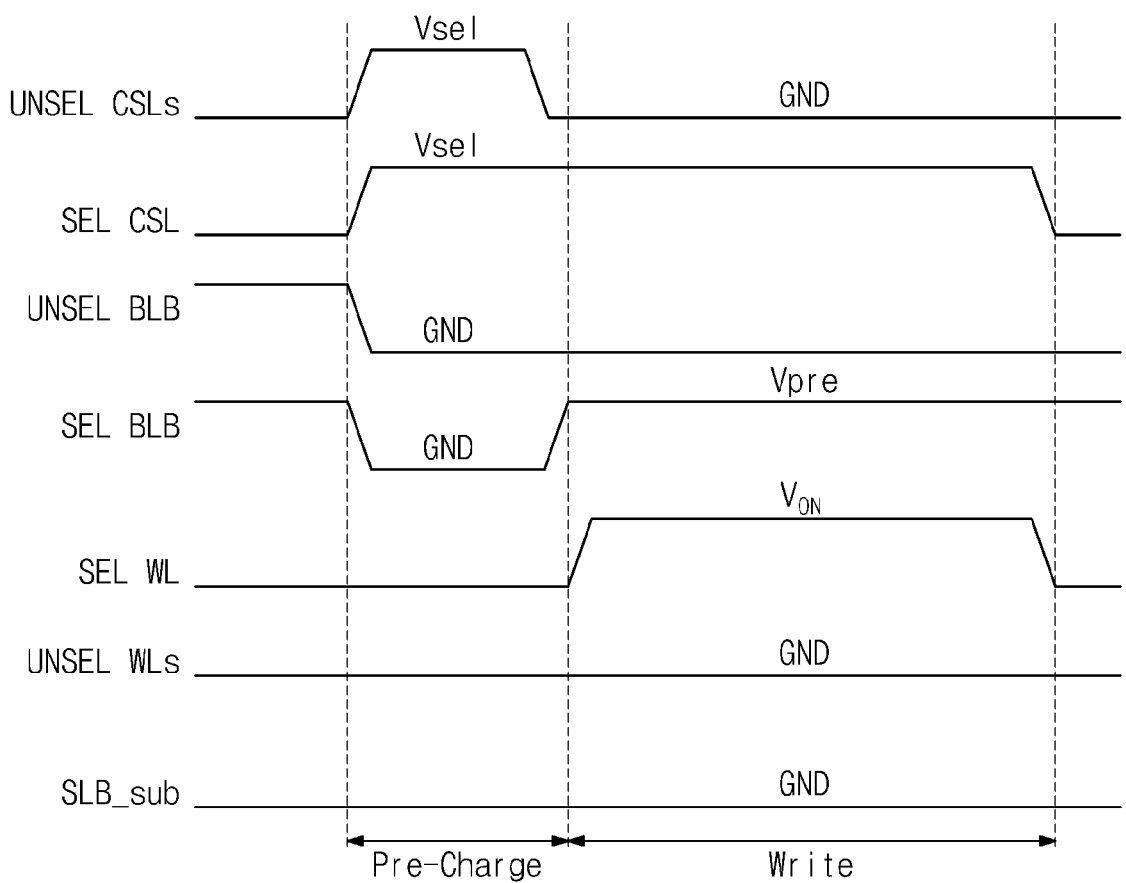
FIG. 12 is a timing diagram for describing a writing operation about a complementary cell of a nonvolatile memory device according to an embodiment of the inventive concepts.

FIG. 12 is a timing diagram for describing a writing operation about a complementary cell of a nonvolatile memory device according to an embodiment of the inventive concepts. Referring to FIG. 12, a writing operation about a complementary cell CC is divided into a pre-charge period and a writing period.

During the pre-charge period, a selection voltage Vsel is applied to unselected column selection lines UNSEL CSLs and a selected column selection line SEL CSL such that a ground voltage GND is applied to all bit lines SEL BL and UNSEL BLs; simultaneously, the ground voltage GND is applied to unselected complementary bit lines UNSEL BLBs and selected complementary bit lines SEL BLB. A ground voltage GND is applied to shared word lines SEL WL and UNSEL WLs and a complementary source line SLB_sub.

During a writing period, a ground voltage GND is applied to the unselected column selection lines UNSEL CSLs, and the selected column selection line SEL CSL is maintained with the selection voltage Vsel. Thus, the unselected bit lines UNSEL BLs maintain the ground voltage GND of the pre-charge period; on the other hand, a pre-charge voltage Vpre is applied to the selected complementary bit line SEL BLB by an inverted value of data stored in the input buffer IBF, that is, complementary data.

At this time, an on voltage Von is applied to the selected word line SEL WL to turn on a complementary transistor TB1, and the unselected word lines UNSEL WLs are maintained with a ground voltage GND. A ground voltage GND is applied to a complementary source line SLB_sub to write complementary data at a complementary cell CC connected to the selected complementary bit line SEL BLB.

At this time, the complementary CC connected to the selected complementary bit line SEL BLB and the complementary source line SLB_sub are electrically connected by the complementary transistor TB1 receiving the on voltage Von. That is, the pre-charge voltage Vpre is applied to one end of the complementary cell CC connected to the selected complementary bit line SEL BLB, and the ground voltage GND is applied to the other end of the complementary cell CC connected to the complementary source line SLB_sub. With the above-described bias condition, since current flows into the complementary cell CC, data is stored. At this time, a current direction may be opposite to that described with reference to FIG. 11.

Figure 13:
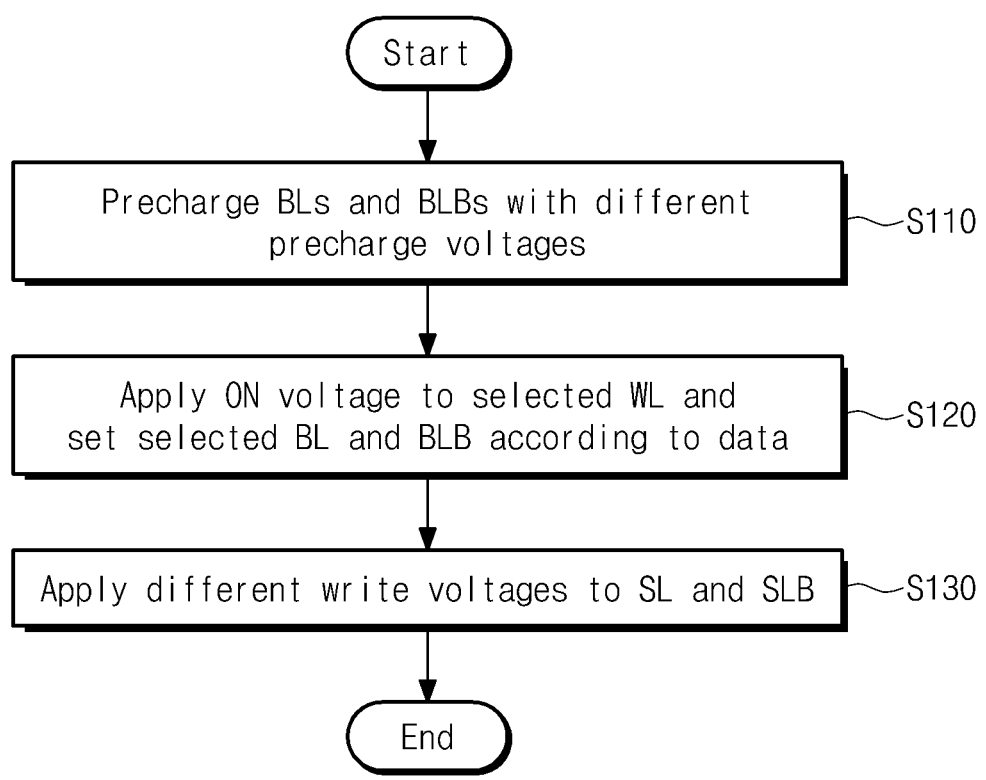
FIG. 13 is a flow chart schematically illustrating a writing method of a nonvolatile memory device according to an embodiment of the inventive concepts.

FIG. 13 is a flow chart schematically illustrating a writing method of a nonvolatile memory device according to an embodiment of the inventive concepts. Below, a writing method will be more fully described with reference to FIGS. 1 to 13.

Bit lines BLs connected to true cells and complementary bit lines BLBs connected to complementary cells are pre-charged with different pre-charge voltages. For example, in step S110, during a pre-charge period, a pre-charge voltage Vpre is applied to the bit lines BLs for a writing operation of a true cell TC, and a ground voltage GND is applied to the complementary bit lines BLBs for a writing operation of a complementary cell CC, as described with reference to FIGS. 11 and 12.

A selected word line SEL WL applies an on voltage to the selection transistor(s) (e.g., T1, T2, TB1, TB2, or etc.) to connect true cells to a source line SL and connect complementary cells to a complementary source line SLB. In step S120, a selected bit line may be set up according to data to be written, and a selected complementary bit line may be set up according to complementary data to be written.

During a time period (e.g., a desired time period or alternatively, a predetermined time period), different write voltages are applied to the source line SL and the complementary source line SLB. For example, in step S130, a write voltage Vwrite is applied to the source line SL as described with reference to FIG. 11, and a ground voltage GND is applied to the complementary source line SLB as described with reference to FIG. 12.

With the writing method of the inventive concepts, different voltages may be applied to a bit line connected to a true cell and a complementary bit line connected to a complementary cell, and different voltages may be applied to a source line connected to the true cell and a complementary source line connected to the complementary cell.

Figure 14:
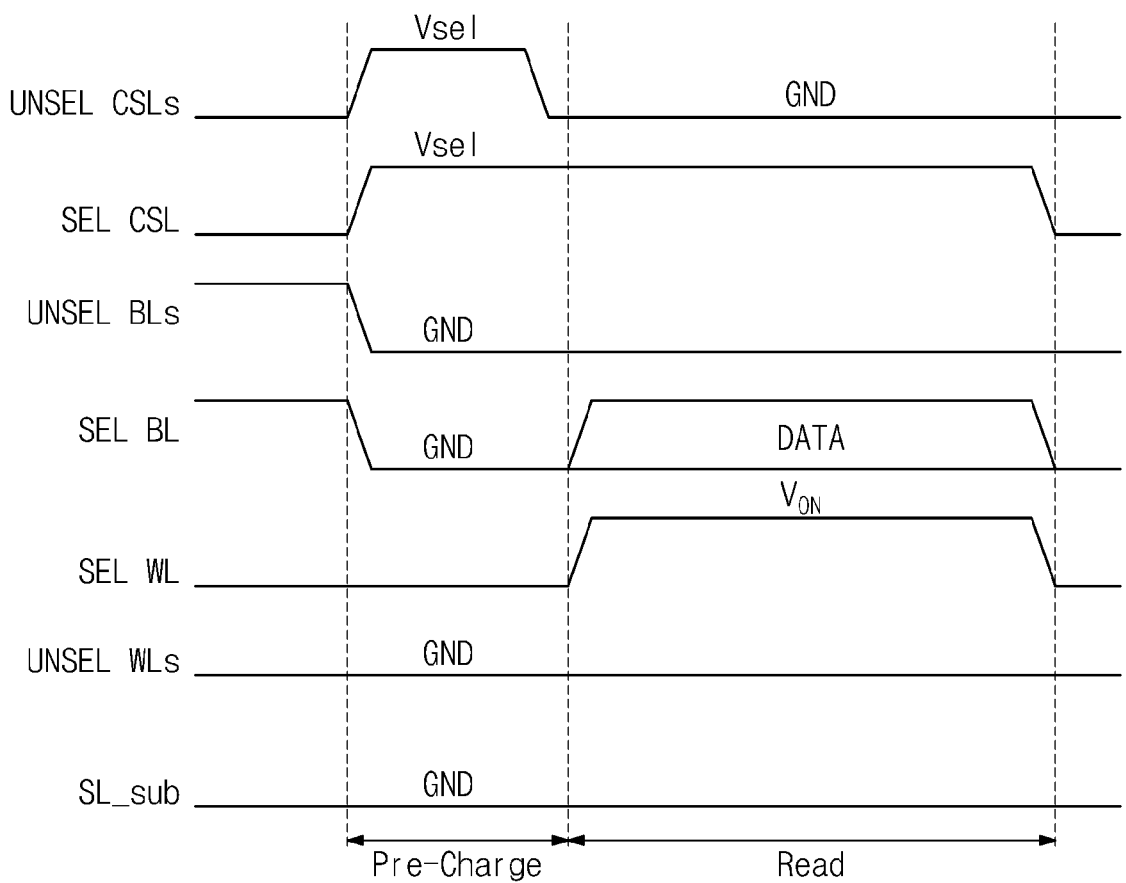
FIG. 14 is a timing diagram for describing a reading operation about a true cell of a nonvolatile memory device according to an embodiment of the inventive concepts.

FIG. 14 is a timing diagram for describing a reading operation for a true cell of a nonvolatile memory device according to an embodiment of the inventive concepts. Referring to FIG. 14, a reading operation about a true cell TC is divided into a pre-charge period and a reading period.

During the pre-charge period, a selection voltage Vsel is applied to unselected column selection lines UNSEL CSLs and a selected column selection line SEL CSL such that a ground voltage GND is applied to all bit lines SEL BL and UNSEL BLs; simultaneously, the ground voltage GND is applied to unselected bit lines UNSEL BLs and selected bit lines SEL BL. A ground voltage GND is applied to word lines SEL WL and UNSEL WLs and a source line SL_sub.

During the reading period, a ground voltage GND is applied to the unselected column selection lines UNSEL CSLs, and the selected column selection line SEL CSL is maintained with the selection voltage Vsel. Thus, the unselected bit lines UNSEL BLs maintain the pre-charge voltage Vpre of the pre-charge period.

At this time, an on voltage Von is applied to the selected word line SEL WL to turn on a transistor T1, the unselected word lines UNSEL WLs are maintained with a ground voltage GND, and a source line SL_sub is maintained with a ground voltage GND. Thus, the selected bit line SEL BL may have a voltage corresponding to data stored in the true cell TC. A sense amplifier SA determines data of the true cell TC by sensing a voltage at the selected bit line SEL BL.

Figure 15:
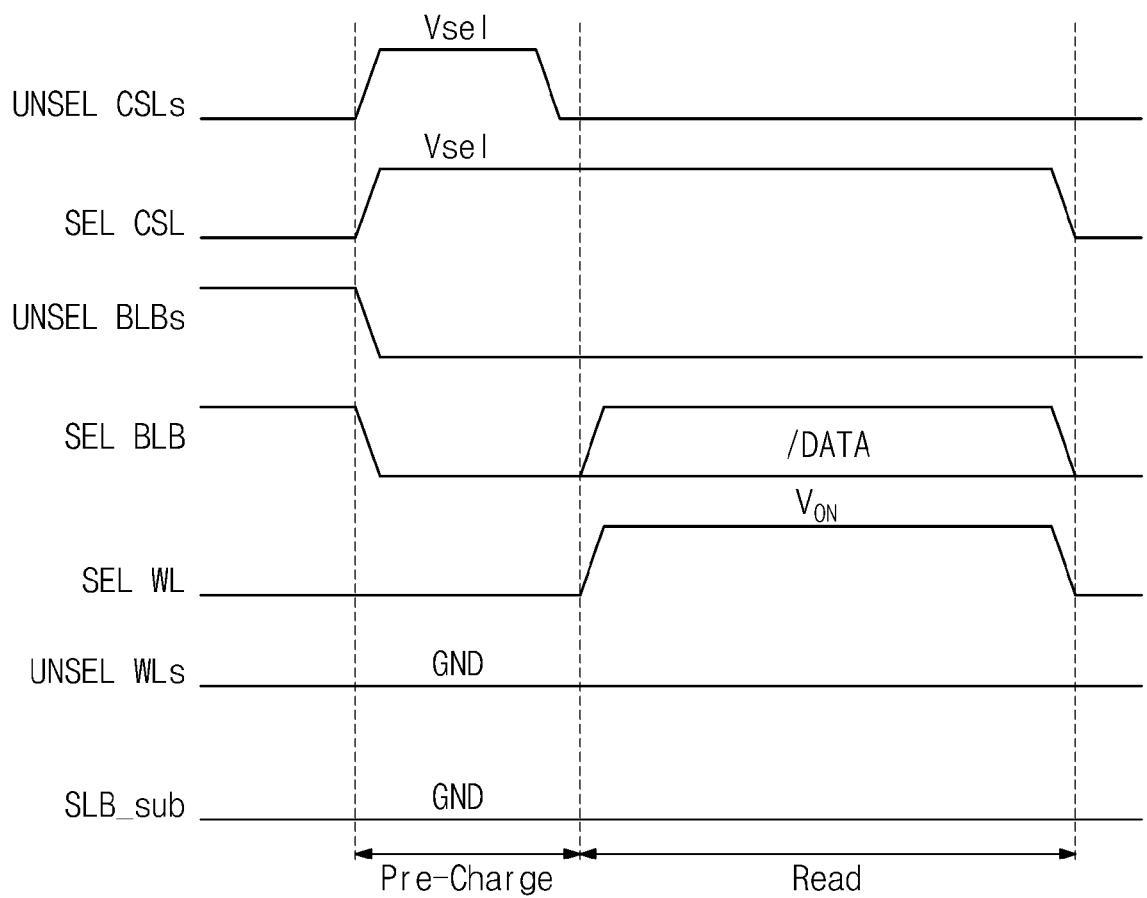
FIG. 15 is a timing diagram for describing a reading operation about a complementary cell of a nonvolatile memory device according to an embodiment of the inventive concepts.

FIG. 15 is a timing diagram for describing a reading operation for a complementary cell of a nonvolatile memory device according to an embodiment of the inventive concepts. Referring to FIG. 15, a reading operation about a complementary cell CC is divided into a pre-charge period and a reading period.

During the pre-charge period, a selection voltage Vsel is applied to unselected column selection lines UNSEL CSLs and a selected column selection line SEL CSL such that a ground voltage GND is applied to all complementary bit lines SEL BLB and UNSEL BLBs; simultaneously, the ground voltage GND is applied to unselected complementary bit lines UNSEL BLs and selected complementary bit lines SEL BL. A ground voltage GND is applied to word lines SEL WL and UNSEL WLs and a source line SL_sub.

During the reading period, a ground voltage GND is applied to the unselected column selection lines UNSEL CSLs, and the selected column selection line SEL CSL is maintained with the selection voltage Vsel. Thus, the unselected bit lines UNSEL BLs maintain the pre-charge voltage Vpre of the pre-charge period. At this time, an on voltage Von is applied to the selected word line SEL WL to turn on a complementary transistor TB1, the unselected word lines UNSEL WLs are maintained with a ground voltage GND, and a complementary source line SL_sub is maintained with a ground voltage GND. Thus, the selected complementary bit line SEL BLB may have a voltage corresponding to data stored in the complementary cell CC. A sense amplifier SA determines data of the complementary cell CC by sensing a voltage at the selected complementary bit line SEL BL.

Figure 16:
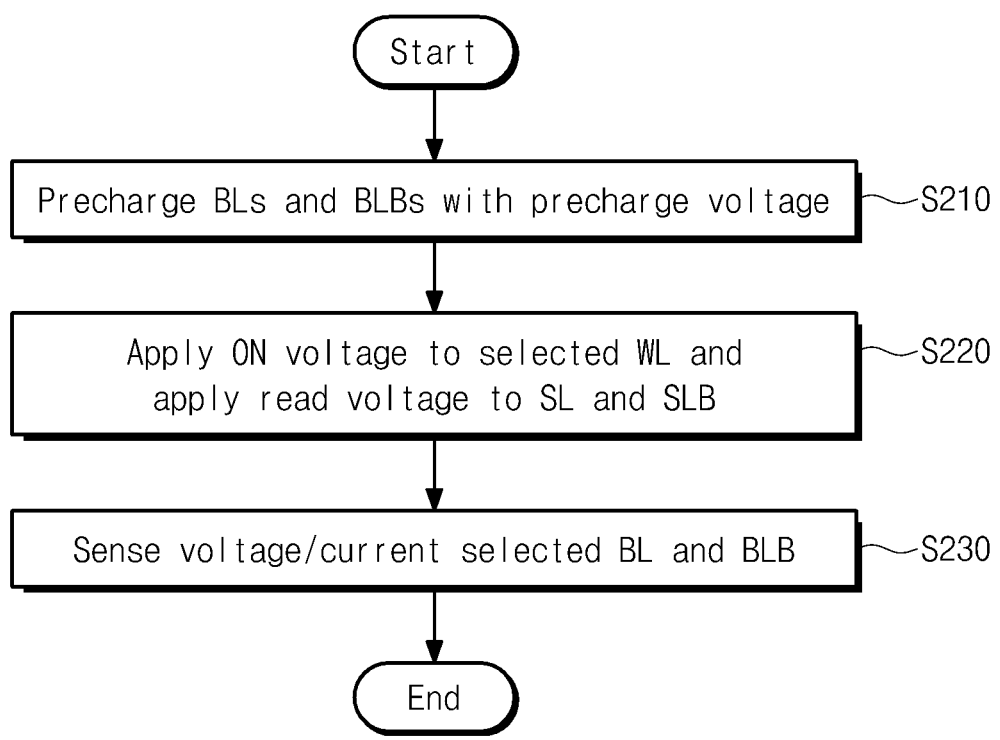
FIG. 16 is a flow chart schematically illustrating a reading method of a nonvolatile memory device according to an embodiment of the inventive concepts.

FIG. 16 is a flow chart schematically illustrating a reading method of a nonvolatile memory device according to an embodiment of the inventive concepts. Below, a reading method will be more fully described with reference to FIGS. 1 to 16.

Bit lines BLs connected to true cells and complementary bit lines BLBs connected to complementary cells are pre-charged with the same pre-charge voltages. For example, in step S210, during a pre-charge period, a ground voltage GND is applied to the bit lines BLs for a reading operation of a true cell TC, and a ground voltage GND is applied to the complementary bit lines BLBs for a reading operation of a complementary cell CC, as described with reference to FIGS. 14 and 15.

A selected word line SEL WL applies an on voltage to selection transistor(s) (e.g., T1, T2, TB1, TB2, or etc.) to connect true cells to a source line SL and connect complementary cells to a complementary source line SLB. In step S220, a read voltage (e.g., GND) is applied to the source line SL and the complementary source line SLB.

The selected bit line SEL BL and the selected complementary bit line SEL BLB are connected to a sense amplifier SA. In step S230, the sense amplifier SA senses voltages or currents at the selected bit line SEL BL and the selected complementary bit line SEL BLB to determine data stored in a true cell.

With the reading method of the inventive concepts, the same pre-charge voltage (e.g., GND) may be applied to a bit line connected to a true cell and a complementary bit line connected to a complementary cell, and the same read voltage GND may be applied to a source line connected to the true cell and a complementary source line connected to the complementary cell.

Figure 17:
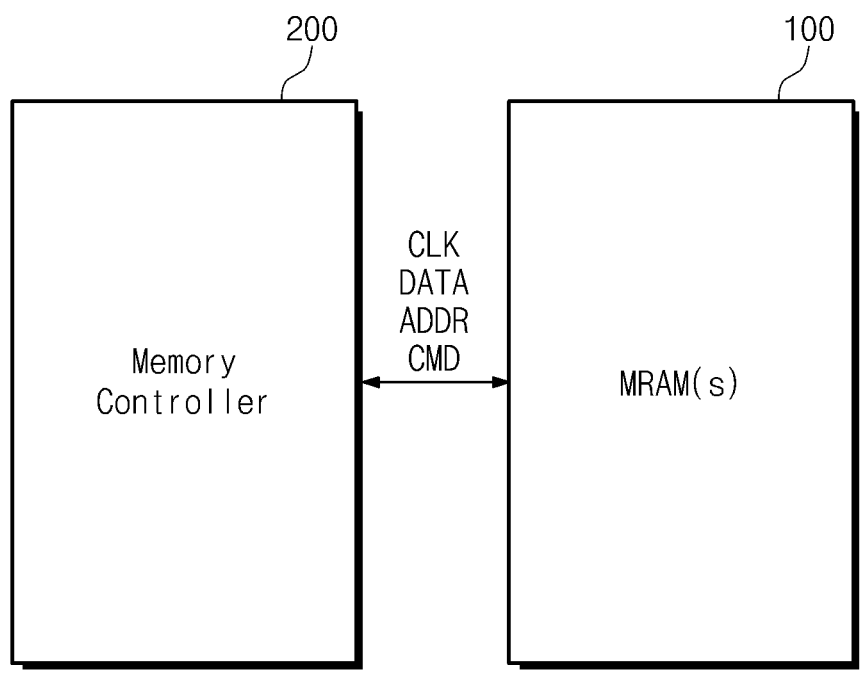
FIG. 17 is a block diagram schematically illustrating a storage device according to an embodiment of the inventive concepts.

FIG. 17 is a block diagram schematically illustrating a storage device according to an embodiment of the inventive concepts. Referring to FIG. 17, a storage device contains at least one nonvolatile memory device 100 and a memory controller 200 to control the same.

The nonvolatile memory device 100 may be implemented to have the same configuration or method as described with reference to FIGS. 1 to 16. In example embodiments, the nonvolatile memory device 100 communicates with the memory controller 200 via a DRAM interface.

The storage device 10 according to an embodiment of the inventive concepts is applicable to a memory module.

Now will be described applications of a nonvolatile memory device of the inventive concepts.

Figure 18:
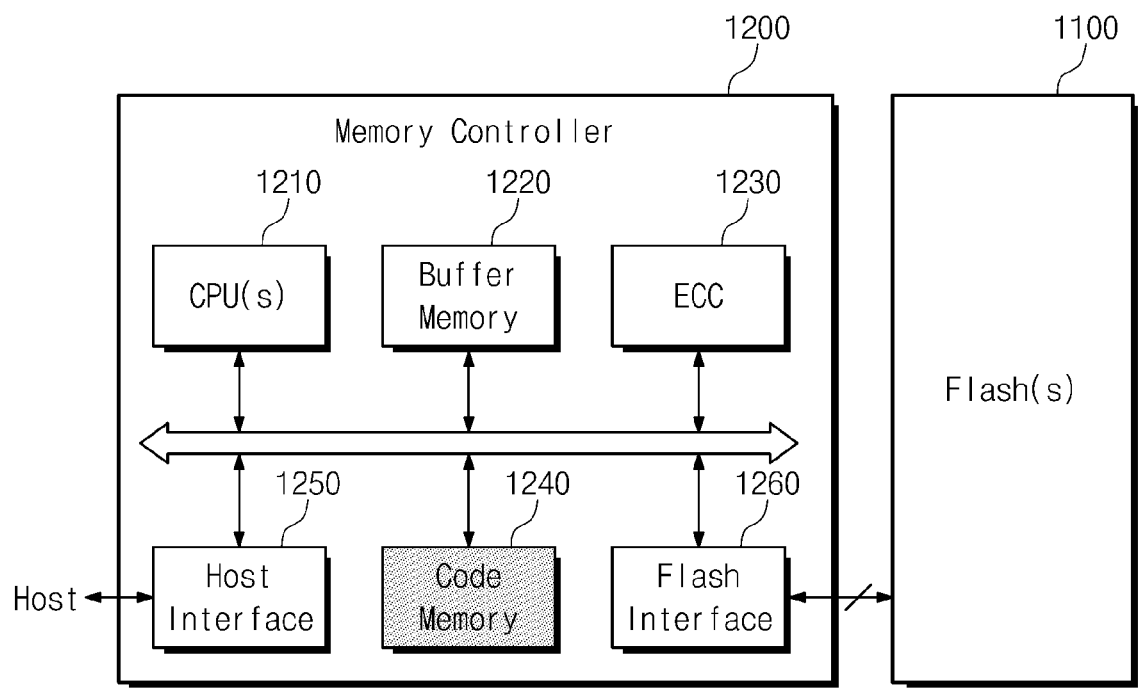
FIG. 18 is a block diagram schematically illustrating a storage device according to an embodiment of the inventive concepts.

FIG. 18 is a block diagram schematically illustrating a storage device 1000 according to an embodiment of the inventive concepts. Referring to FIG. 18, a storage device 1000 contains at least one flash memory device 1100 and a memory controller 1200 to control the flash memory device 1100. The storage device 1000 shown in FIG. 18 may be used as, but not limited to, a storage medium of a memory card (e.g., CF, SD, micro SD, and so on) or an USB storage device.

The flash memory device 1100 may be implemented with a NAND flash memory or VNAND. The memory controller 1200 controls read, write, and erase operations of the flash memory device 1100 in response to a host request. The memory controller 1200 contains at least one central processing unit 1210, a buffer memory 1220, an ECC block 1230, a code memory 1240, a host interface 1250, and a flash interface 1260.

The central processing unit 1210 controls an overall operation of the flash memory device 1100 including writing, reading, management of a file system, management of bad pages, and so on. The buffer memory 1220 operates in response to a control of the central processing unit 1210 and is used as a work memory, a buffer memory, and a cache memory. If the buffer memory 1220 is used as a work memory, data processed by the central processing unit 1210 is temporarily stored therein. The buffer memory 1220 is used to buffer data that is transferred from a host to the flash memory device 1100 or from the flash memory device 1100 to the host. In case the buffer memory 1220 is used as a cache memory, it may enable a low-speed flash memory device 1100 to operate at high speed.

The ECC block 1230 generates an error correction code ECC for correcting a fail bit or an error bit of data received from the flash memory device 1100. The ECC block 1230 performs error correction encoding on data to be provided to the flash memory device 1100, so a parity bit is added thereto. The parity bit may be stored in the flash memory device 1100.

The ECC block 1230 performs error correction decoding on data output from the flash memory device 1100. The ECC block 1230 corrects an error using the parity. The ECC block 1230 corrects an error using LDPC (Low Density Parity Check) code, BCH code, turbo code, RS (Reed-Solomon) code, convolution code, RSC (Recursive Systematic Code), TCM (Trellis-Coded Modulation), BCM (Block Coded Modulation), etc.

The code memory 1240 stores operating system/code data to drive the storage device 1000. The code memory 1240 may be implemented with a nonvolatile memory device 100 described with reference to FIGS. 1 to 17.

The memory controller 1200 exchanges data with the host through the host interface 1250 and with the flash memory device 1100 through the flash interface 1260. The host interface 1250 may be connected with a host via PATA (Parallel AT Attachment bus), SATA (Serial AT attachment bus), SCSI, USB, PCIe, NAND interface, etc.

In at least one example embodiment, the memory controller 1200 may include a RF communication function (e.g., WiFi).

The storage device 1000 according to an embodiment of the inventive concepts includes the code memory 1240 capable of increasing or maximizing sensing margin and reducing a chip size. Thus, it is possible to improve performance of the storage device 1000.

The inventive concepts are applicable to a memory card.

Figure 19:
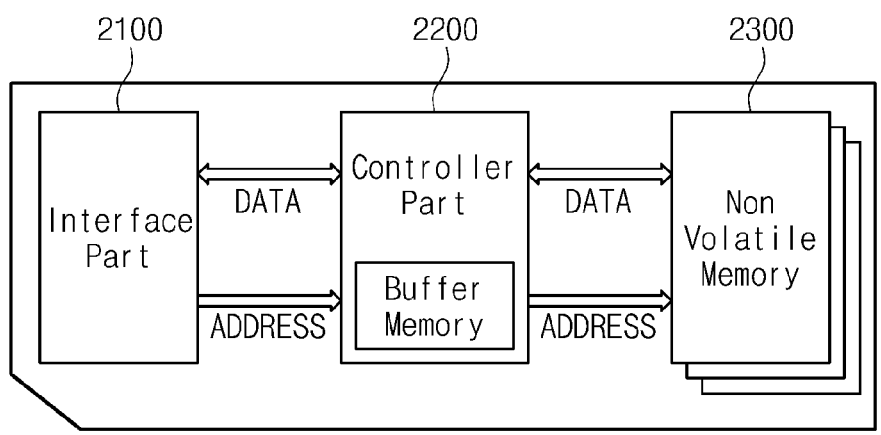
FIG. 19 is a block diagram schematically illustrating a memory card according to an embodiment of the inventive concepts.

FIG. 19 is a block diagram schematically illustrating a memory card 2000 according to an embodiment of the inventive concepts. A memory card 2000 may be, for example, an MMC, an SD card, a multiuse card, a micro-SD card, a memory stick, a compact SD card, an ID card, a PCMCIA card, an SSD card, a chip card, a smart card, an USB card, etc.

Referring to FIG. 19, the memory card 2000 contains an interface part 2100 to interface with an external device, a controller 2200 including a buffer memory and controlling an operation of the memory card 2000, and at least one nonvolatile memory device 2300 according to one or more embodiments of the inventive concepts. The controller 2200 is a processor and controls writing and reading operations of the nonvolatile memory device 2300. The controller 2200 is coupled with the nonvolatile memory device 2300 and the interface part 2100 through a data bus DATA and an address bus ADDRESS.

The memory card 2000 according to an embodiment of the inventive concepts may be advantageous to integration by reducing a chip size.

The inventive concepts are applicable to universal flash storage (UFS).

Figure 20:
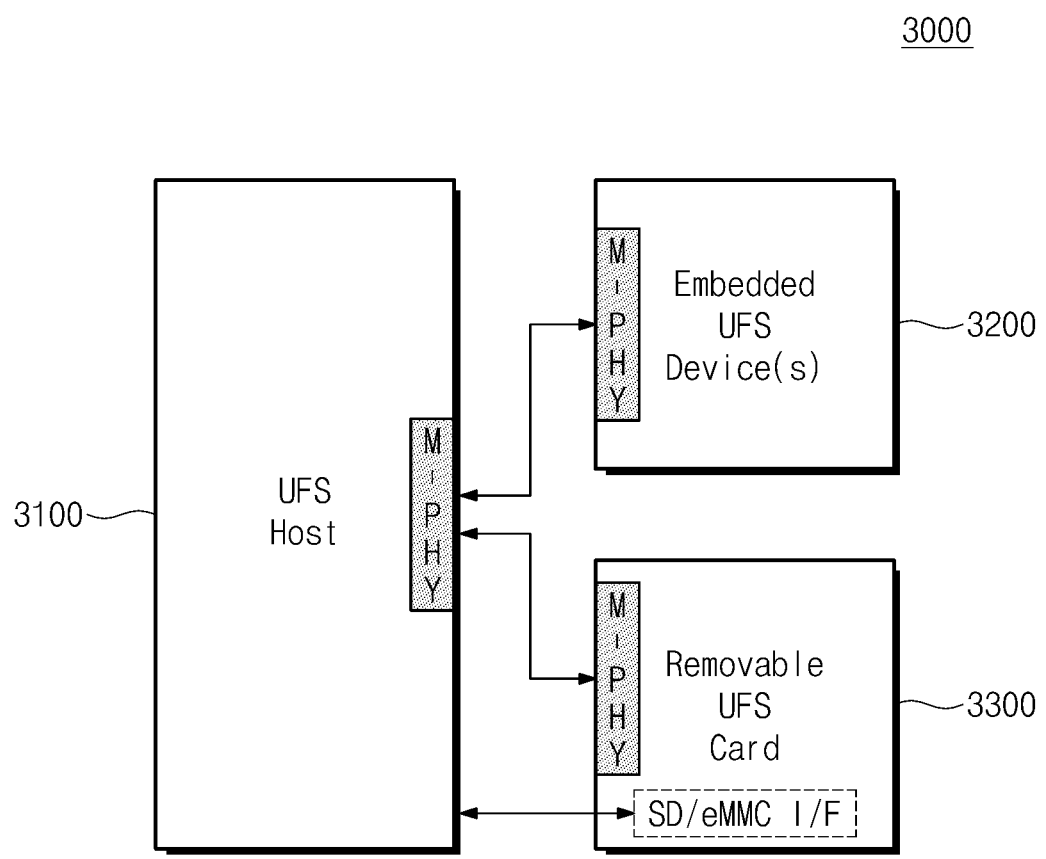
FIG. 20 is a block diagram schematically illustrating an UFS system according to an embodiment of the inventive concepts.

FIG. 20 is a block diagram schematically illustrating an Universal Flash Storage (UFS) system according to an embodiment of the inventive concepts. Referring to FIG. 20, an UFS system 3000 includes an UFS host 3100, at least one embedded UFS device 3200, and a removable UFS card 3300. Communication between the UFS host 3100 and the embedded UFS device 3200 and communication between the UFS host 3100 and the removable UFS card 3300 may be made via M-PHY layers.

At least one of the components 3200 and 3300 may be implemented with a storage device 10 illustrated in FIG. 17.

Meanwhile, the host 3100 may include a bridge that supports communication based on a protocol different from the UFS protocol. The UFS host 3100 and the removable UFS card 3400 may communicate with each other through a variety of card protocols: UFDs, MMC, eMMC SD (secure digital), mini SD, Micro SD, etc.

The inventive concepts are applicable to a mobile device.

Figure 21:
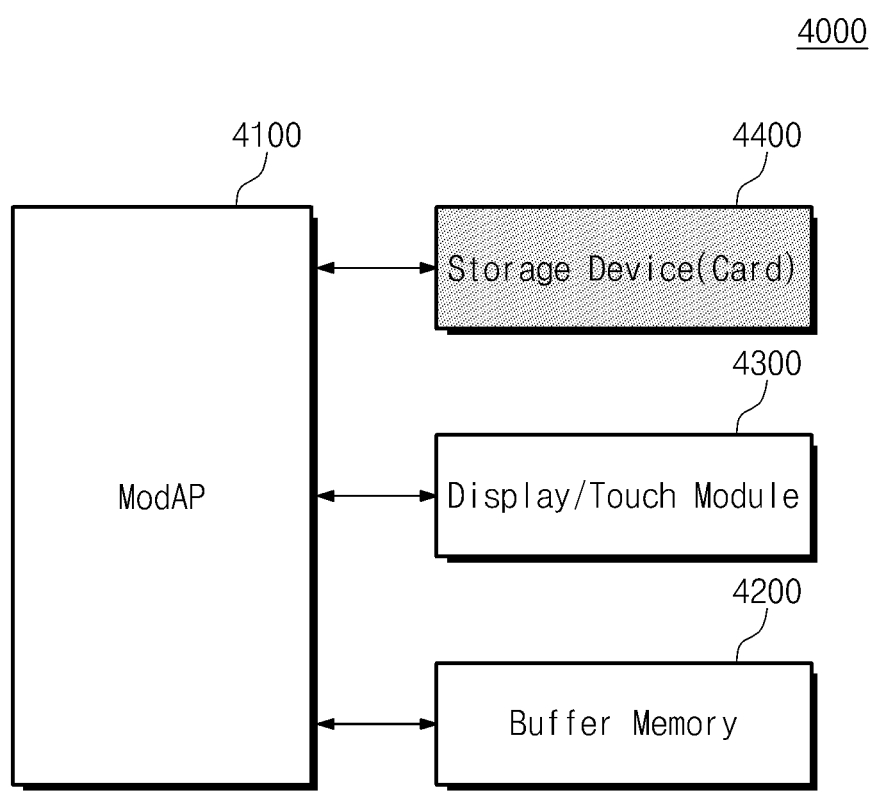
FIG. 21 is a block diagram schematically illustrating a mobile device according to an embodiment of the inventive concepts.

FIG. 21 is a block diagram schematically illustrating a mobile device 4000 according to an embodiment of the inventive concepts. Referring to FIG. 21, a mobile device 4000 includes a unified processor 4100, a buffer memory 4200, a display/touch module 4300, and a storage device 4400.

The unified processor 4100 is configured to control an overall operation of the mobile device 4000 and wire/wireless communication with an external device. The buffer memory 4200 is configured to temporarily store data for a processing operation of the mobile device 4000. The display/touch module 4300 is configured to display data processed by the unified processor 4100 or receive data from a touch panel. The storage device 4400 is configured to store user data. The storage device 4400 may be an eMMC, SSD, or UFS device. At least one of the buffer memory 4200 and the storage device 4400 may contain a nonvolatile memory device 100 described with reference to FIGS. 1 to 17.

The mobile device 4000 according to an embodiment of the inventive concepts may include the buffer memory 4200 or the storage device 4400 implemented with a nonvolatile memory device that is advantageous to integration.

A memory system and/or a storage device according to the inventive concepts may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

While the inventive concepts have been described with reference to example embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device comprising:
first and second true cells storing data;
first and second complementary cells storing complementary data of the data;
bit lines respectively connected to first ends of the first and second true cells;
complementary bit lines respectively connected to first ends of the first and second complementary cells;
a first sub word line connected to second ends of the first true cells;
a second sub word line connected to second ends of the second true cells;
a first complementary sub word line connected to second ends of the first complementary cells;
a second complementary sub word line connected to second ends of the second complementary cells; and
a first transistor configured to connect the first sub word line to a first source line in response to a first on voltage applied to a first word line;
a first complementary transistor configured to connect the first complementary sub word line to a first complementary source line in response to the first on voltage;
a second transistor configured to connect the second sub word line to the first source line in response to a second on voltage applied to a second word line; and
a second complementary transistor configured to connect the second complementary sub word line to the first complementary source line in response to the second on voltage.

2. The nonvolatile memory device of claim 1, wherein each of the first and second true cells and the first and second complementary cells is a magnetic tunnel junction (MTJ) cell.

3. The nonvolatile memory device of claim 2, wherein the first and second word lines extend in a same direction as that of the first source line and the second complementary source line.

4. The nonvolatile memory device of claim 1, further comprising:
bit line selection transistors configured to selectively connect one of the bit lines to a first data line in response to column selection signals; and
complementary bit line selection transistors configured to selectively connect one of the complementary bit lines to a second data line in response to the column selection signals.

5. The nonvolatile memory device of claim 4, further comprising:
an input buffer providing the first data line with a voltage corresponding to the data; and
a complementary input buffer providing the second data line with a voltage corresponding to the complementary data.

6. The nonvolatile memory device of claim 5, wherein after a pre-charge voltage is applied to the bit lines in a writing operation about one of the first and second true cells, a ground voltage is applied to a selected bit line, an on voltage is applied to a selected word line, and a write voltage is applied to the first source line.

7. The nonvolatile memory device of claim 5, wherein after a ground voltage is applied to the complementary bit lines in a writing operation about one of the first and second complementary cells, the pre-charge voltage is applied to a selected complementary bit line, an on voltage is applied to a selected word line, and a ground voltage is applied to the first complementary source line.

8. The nonvolatile memory device of claim 4, further comprising:
a sense amplifier configured to sense voltage or current at the first data line and the second data line.

9. The nonvolatile memory device of claim 8, wherein after a ground voltage is applied to the bit lines at a reading operation about one of the first and second true cells, an on voltage is applied to a selected word line, and a ground voltage is applied to the first source line.

10. The nonvolatile memory device of claim 8, wherein after a ground voltage is applied to the complementary bit lines at a reading operation about one of the first and second complementary cells, an on voltage is applied to a selected word line, and a ground voltage is applied to the first complementary source line.

11. The nonvolatile memory device of claim 1, further comprising:
a source line control circuit configured to control a voltage applied to the first source line and the first complementary source line independently in response to source line control signals.

12. The nonvolatile memory device of claim 11, further comprising:

a source line control signal generator configured to generate the source line control signals in response to data, a read enable signal, and a write enable signal.

13. The nonvolatile memory device of claim 1, wherein the on voltage is a power supply voltage.

14. A non-volatile memory device, comprising:
a source line structure;
a plurality of true memory cells connected between first respective bit lines and a sub word line structure;
a plurality of complementary memory cells connected between respective complementary bit lines and the sub word line structure;
a selection structure configured to selectively electrically connect the source line structure to the sub word line structure;
a control circuit configured to control the selection structure during at least one of a read operation and a write operation such that a first sub word line in the sub word line structure is connected to a first source line in the source line structure and a second sub word line in the sub word line structure is connected to a second source line in the source line structure based on application of an on voltage to a single word line, the first sub word line connected to the plurality of true memory cells, and the second sub word line connected to the plurality of complementary memory cells.

15. The non-volatile memory device of claim 14, wherein the first sub word line and the second sub word line are one of a same sub word line and different sub word lines, and the first source line and the second source line are one of a same source line and different source lines.

* * * * *